(12) United States Patent
Nakashima et al.

(10) Patent No.: US 8,154,060 B2
(45) Date of Patent: Apr. 10, 2012

(54) IMAGE SENSOR AND SENSOR UNIT

(75) Inventors: Hayato Nakashima, Anpachi-gun (JP); Ryu Shimizu, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 285 days.

(21) Appl. No.: 12/183,129

(22) Filed: Jul. 31, 2008

(65) Prior Publication Data

US 2009/0032854 A1 Feb. 5, 2009

(30) Foreign Application Priority Data

Jul. 31, 2007 (JP) ................................. 2007-199890

(51) Int. Cl.
*H01L 31/062* (2012.01)
(52) U.S. Cl. ............. 257/291; 257/292; 257/59; 257/72
(58) Field of Classification Search .................. 257/291, 257/292
See application file for complete search history.

(56) References Cited

U.S. PATENT DOCUMENTS

| | | | | |
|---|---|---|---|---|
| 4,093,872 A | * | 6/1978 | Hartman et al. | 377/57 |
| 6,862,333 B2 | * | 3/2005 | Kashima et al. | 377/60 |
| 7,719,037 B2 | * | 5/2010 | Haraguchi | 257/239 |
| 2009/0134438 A1 | * | 5/2009 | Arimoto et al. | 257/292 |

FOREIGN PATENT DOCUMENTS

JP 07-176721 B2 7/1995

* cited by examiner

*Primary Examiner* — Wai Sing Louie
*Assistant Examiner* — Bilkis Jahan
(74) *Attorney, Agent, or Firm* — Ditthavong Mori & Steiner, P.C.

(57) ABSTRACT

This image sensor is so formed as to control at least either the potential of a portion of a transfer channel corresponding to a third electrode or the potential of another portion of the transfer channel corresponding to a fourth electrode to be lower than the potentials of portions of the transfer channel corresponding to a first electrode and a second electrode respectively in a signal charge transferring operation and a signal charge increasing operation.

19 Claims, 17 Drawing Sheets

IMAGE SENSOR AND SENSOR UNIT

CROSS-REFERENCE TO RELATED APPLICATIONS

The priority application number JP2007-199890, Image Sensor, Jul. 31, 2007, Hayato Nakashima, Ryu Shimizu, upon which this patent application is based is hereby incorporated by reference.

BACKGROUND OF THE INVENTION

1. Field of the Invention

The present invention relates to an image sensor and a sensor unit, and more particularly, it relates to an image sensor and a sensor unit each comprising a region for increasing the number of signal charges.

2. Description of the Background Art

In general, a CMOS image sensor comprises a photodiode for photoelectrically converting incident light to electrons, an electrode for reading electrons stored in the photodiode and a floating diffusion region for converting the stored electrons (signal charges) into a voltage signal.

In relation to this, a method of increasing (multiplying) the number of the electrons by impact-ionizing the stored electrons in order to improve sensitivity is conceivable. When this method of increasing the number of the electrons is employed, various examinations are required.

SUMMARY OF THE INVENTION

An image sensor according to a first aspect of the present invention comprises a first electrode for forming an electric field storing signal charges, a second electrode for forming another electric field increasing the number of the signal charges by impact ionization, a photoelectric conversion portion generating the signal charges, a third electrode provided to be adjacent to the photoelectric conversion portion for transferring the signal charges, a voltage conversion portion for converting the signal charges into a voltage, a fourth electrode provided to be adjacent to the voltage conversion portion for transferring the signal charges to the voltage conversion portion and a transfer channel provided under the first electrode, the second electrode, the third electrode and the fourth electrode for performing a signal charge transferring operation and a signal charge increasing operation, while at least either the potential of a portion of the transfer channel corresponding to the third electrode or the potential of another portion of the transfer channel corresponding to the fourth electrode is controlled to be lower than the potentials of portions of the transfer channel corresponding to the first electrode and the second electrode respectively in the signal charge transferring operation and the signal charge increasing operation.

A sensor unit according to a second aspect of the present invention comprises a first electrode for forming an electric field storing signal charges, a second electrode for forming another electric field increasing the number of the signal charges by impact ionization, a charge generating portion generating the signal charges, a third electrode provided to be adjacent to the charge generating portion for transferring the signal charges, a voltage conversion portion for converting the signal charges into a voltage, a fourth electrode provided to be adjacent to the voltage conversion portion for transferring the signal charges to the voltage conversion portion and a transfer channel provided under the first electrode, the second electrode, the third electrode and the fourth electrode for performing a signal charge transferring operation and a signal charge increasing operation, while at least either the potential of a portion of the transfer channel corresponding to the third electrode or the potential of another portion of the transfer channel corresponding to the fourth electrode is controlled to be lower than the potentials of portions of the transfer channel corresponding to the first electrode and the second electrode respectively in the signal charge transferring operation and the signal charge increasing operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, the structure of a CMOS image sensor according to a first embodiment of the present invention is described with reference to FIGS. 1 to 5. The first embodiment of the present invention is applied to a passive CMOS image sensor employed as an exemplary image sensor.

Figure 1:
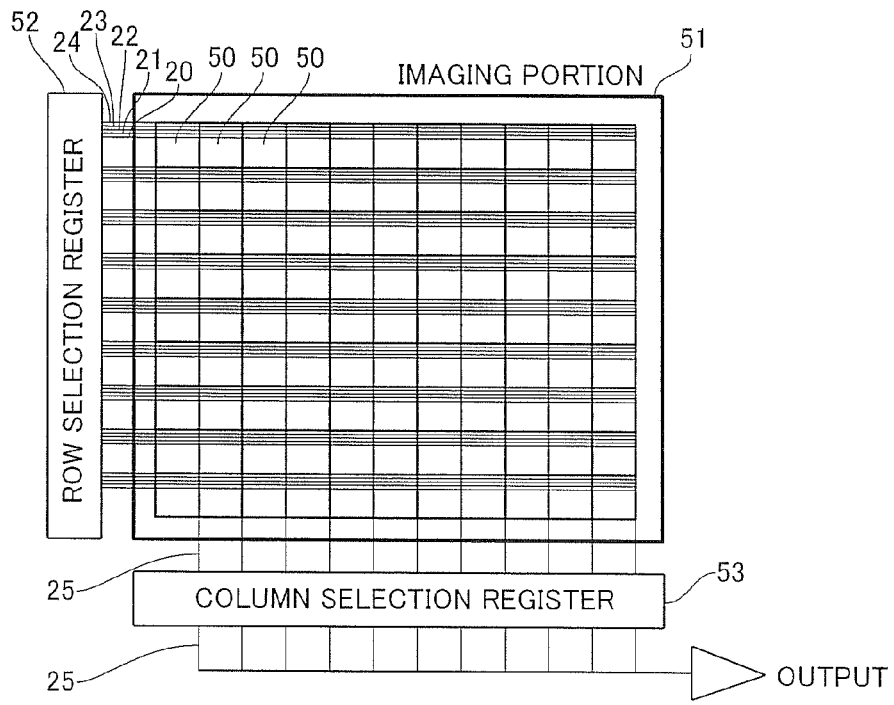
FIG. 1 is a plan view showing the overall structure of a CMOS image sensor according to a first embodiment of the present invention.

The CMOS image sensor according to the first embodiment comprises an imaging portion 51 including a plurality of pixels 50 arranged in the form of a matrix, a row selection register 52 and a column selection register 53, as shown in FIG. 1.

Figure 2:
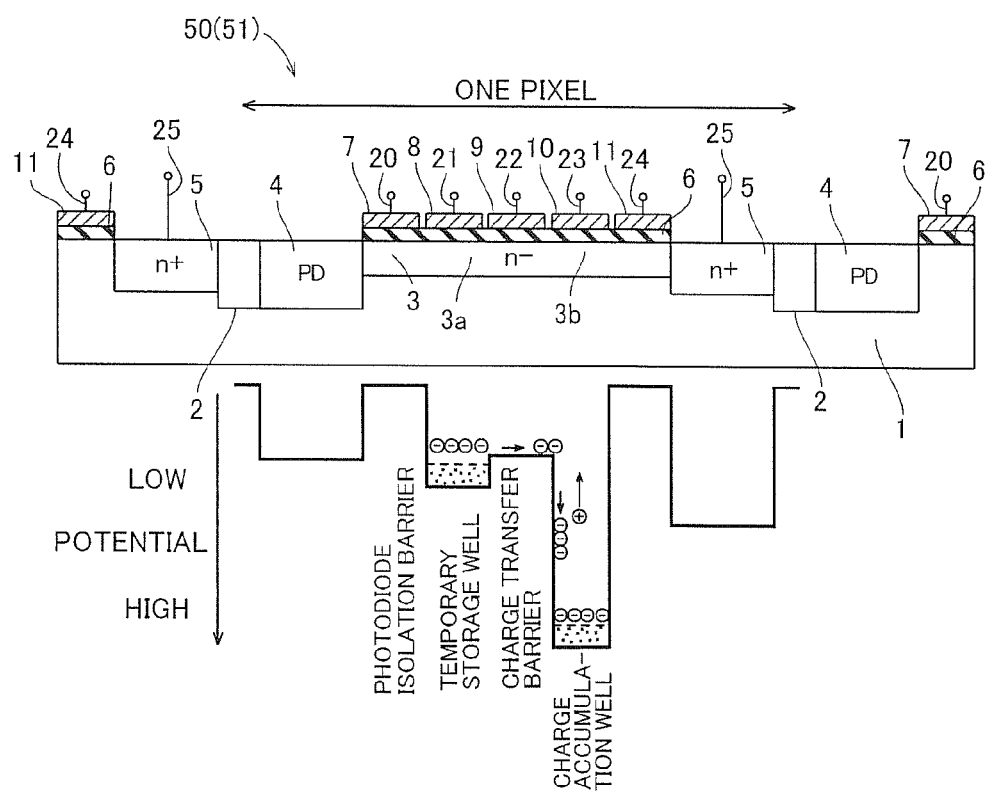
FIG. 2 is a potential diagram in the CMOS image sensor according to the first embodiment of the present invention.
Figure 3:
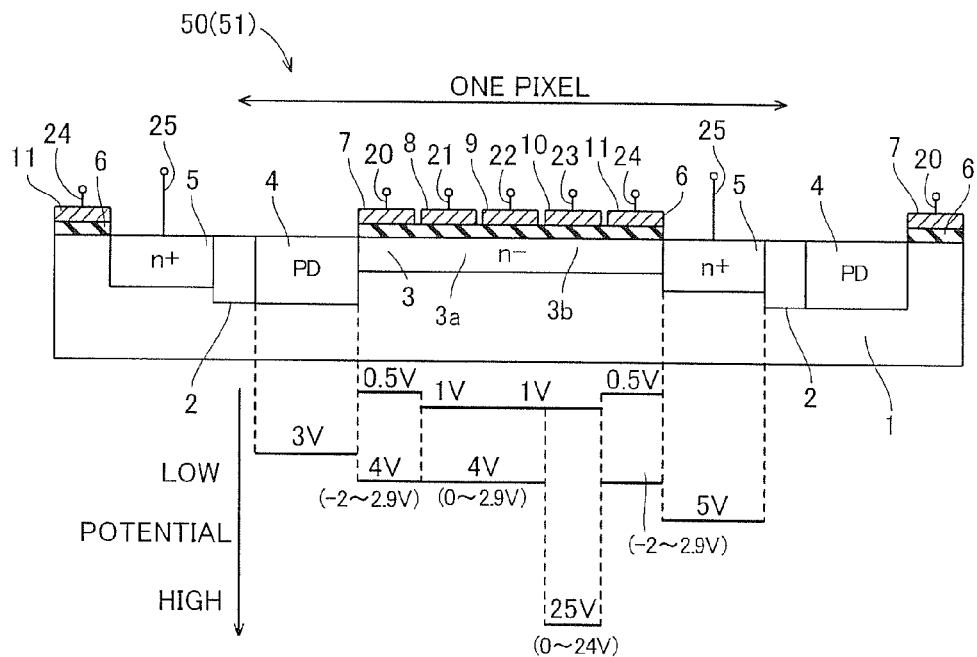
FIG. 3 is a sectional view showing the structure of the CMOS image sensor according to the first embodiment of the present invention.

As to the sectional structure of the pixels 50 of the CMOS image sensor according to the first embodiment, element isolation regions 2 for isolating the pixels 50 from each other are formed on the surface of a p-type silicon substrate 1, as shown in FIGS. 2 and 3. On a surface portion of the p-type silicon substrate 1 provided with each pixel 50 enclosed with the corresponding element isolation regions 2, a photodiode (PD) portion 4 and a floating diffusion (FD) region 5 consisting of an n+-type impurity region are formed at a prescribed interval, to hold a transfer channel 3 consisting of an n−-type impurity region therebetween. The photodiode portion 4 is an example of the "photoelectric conversion portion" in the present invention, and the floating diffusion region 5 is an example of the "voltage conversion portion" in the present invention.

The PD portion 4 has a function of generating electrons in response to the quantity of incident light and storing the generated electrons. The PD portion 4 is formed to be adjacent to the corresponding element isolation region 2 as well as to the transfer channel 3. The FD region 5 has an impurity concentration (n+) higher than the impurity concentration (n−) of the transfer channel 3. The FD region 5 has a function of holding signal charges formed by transferred electrons and converting the signal charges into a voltage. The FD region 5 is formed to be adjacent to the corresponding element isolation region 2 as well as to the transfer channel 3. Thus, the FD region 5 is opposed to the PD portion 4 through the transfer channel 3.

According to the first embodiment, a gate insulating film 6 is formed on the upper surface of the transfer channel 3. On prescribed regions of the upper surface of the gate insulating film 6, transfer gate electrodes 7, 8 and 9, a multiplier gate electrode 10 and a readout gate electrode 11 are formed in this order from the side of the PD portion 4 toward the side of the FD region 5. In other words, the transfer gate electrode 7 is formed to be adjacent to the PD portion 4. Further, the transfer gate electrode 7 is formed between the PD portion 4 and the transfer gate electrode 8. The transfer gate electrode 9 is formed between the transfer gate electrode 8 and the multiplier gate electrode 10. The readout gate electrode 11 is formed between the multiplier gate electrode 10 and the FD region 5. The readout gate electrode 11 is formed to be adjacent to the FD region 5. The transfer gate electrodes 7, 8 and 9 are examples of the "third electrode", the "first electrode" and the "fifth electrode" in the present invention respectively. The multiplier gate electrode 10 is an example of the "second electrode" in the present invention, and the readout gate electrode 11 is an example of the "fourth electrode" in the present invention.

Figure 4:
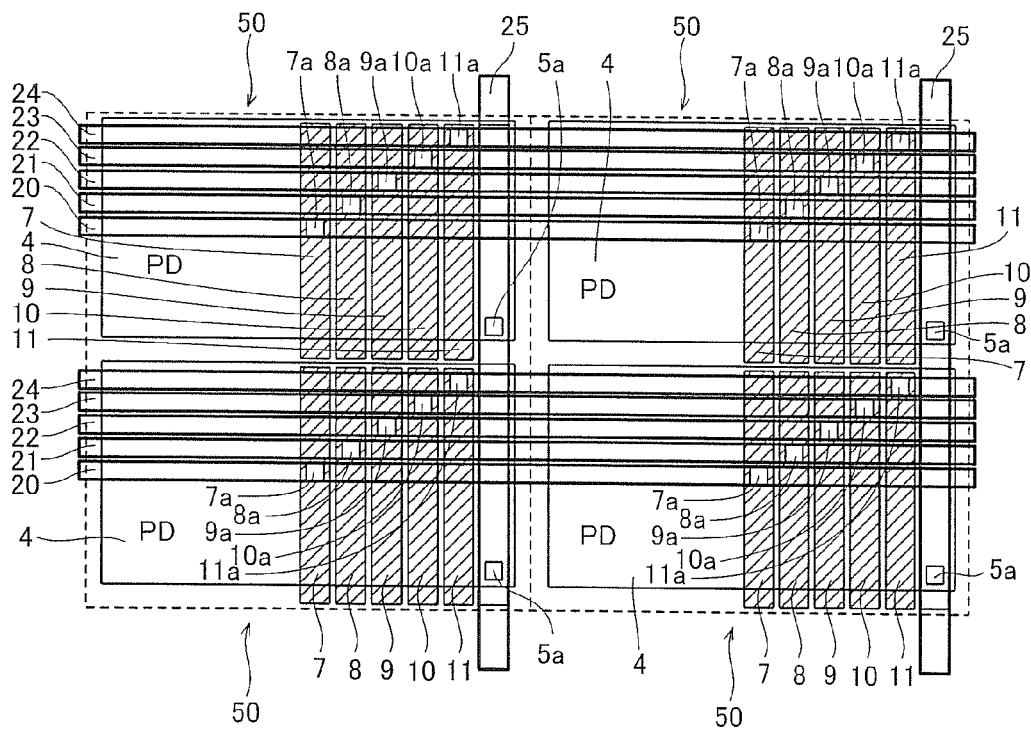
FIG. 4 is a plan view showing pixels in the CMOS image sensor according to the first embodiment of the present invention.

As shown in FIG. 4, wiring layers 20, 21, 22, 23 and 24 supplying clock signals $\phi 1$, $\phi 2$, $\phi 3$, $\phi 4$ and $\phi 5$ for voltage control are electrically connected to the transfer gate electrodes 7, 8 and 9, the multiplier gate electrode 10 and the readout gate electrode 11 through contact portions 7a, 8a, 9a, 10a and 11a respectively. The wiring layers 20, 21, 22, 23 and 24 are formed every row, and electrically connected to the transfer gate electrodes 7, 8, 9, the multiplier gate electrodes 10 and the readout gate electrodes 11 of the plurality of pixels 50 forming each row respectively. A signal line 25 for extracting a signal through a contact portion 5a is electrically connected to the FD region 5. This signal line 25 is formed every column, and electrically connected to the FD regions 5 of the plurality of pixels 50 forming each column.

When ON-state (high-level) clock signals $\phi 1$, $\phi 2$, $\phi 3$ and $\phi 5$ are supplied to the transfer gate electrodes 7, 8 and 9 and the readout gate electrode 11 through the wiring layers 20, 21, 22 and 24 respectively, voltages of about 2.9 V are applied to the transfer gate electrodes 7, 8 and 9 and the readout gate electrode 11, as shown in FIG. 3. Thus, portions of the transfer channel 3 located under the transfer gate electrodes 7, 8 and 9 and the readout gate electrode 11 respectively are controlled to potentials of about 4 V when the ON-state (high-level) clock signals $\phi 1$, $\phi 2$, $\phi 3$ and $\phi 5$ are supplied to the transfer gate electrodes 7, 8 and 9 and the readout gate electrode 11 respectively.

When OFF-state (low-level) clock signals $\phi 1$ and $\phi 5$ are supplied to the transfer gate electrode 7 and the readout gate electrode 11 respectively, voltages of about −2 V are applied to the transfer gate electrode 7 and the readout gate electrode 11 in the first embodiment. Thus, the portions of the transfer channel 3 located under the transfer gate electrode 7 and the readout gate electrode 11 respectively are controlled to potentials of about 0.5 V. When OFF-state (low-level) clock signals $\phi 2$, $\phi 3$ and $\phi 4$ are supplied to the transfer gate electrodes 8 and 9 and the multiplier gate electrode 10 respectively, voltages of about 0 V are applied to the transfer gate electrodes 8 and 9 and the multiplier gate electrode 10. Thus, the portions of the transfer channel 3 located under the transfer gate electrodes 8 and 9 and the multiplier gate electrode 10 respectively are controlled to potentials of about 1 V.

When an ON-state (high-level) clock signal $\phi 4$ is supplied to the multiplier gate electrode 10 through the wiring layer 23, a voltage of about 24 V is applied to the multiplier gate electrode 10. Thus, the portion of the transfer channel 3 located under the multiplier gate electrode 10 is controlled to a high potential of about 25 V when the ON-state (high-level) clock signal $\phi 4$ is supplied to the multiplier gate electrode 10. The PD portion 4 and the FD region 5 are controlled to potentials of about 3 V and about 5 V respectively.

Thus, an electric field temporarily storing electrons is formed in the portion (electron storage portion (temporary storage well) 3a) of the transfer channel 3 located under the transfer gate electrode 8 when the ON-state (high-level) clock signal φ2 is supplied to the transfer gate electrode 8, as shown in FIG. 2.

When the ON-state (high-level) clock signal φ4 is supplied to the multiplier gate electrode 10, the portion (electron multiplying portion (charge accumulation well) 3b) of the transfer channel 3 located under the multiplier gate electrode 10 is controlled to the potential of about 25 V, so that a high electric field impact-ionizing electrons and multiplying (increasing) the number thereof is formed in the portion (electron multiplying portion (charge accumulation well) 3b) of the transfer channel 3 located under the multiplier gate electrode 10. The impact ionization of the electrons is caused on the boundary between the portion (electron multiplying portion 3b) of the transfer channel 3 located under the multiplier gate electrode 10 and the portion of the transfer channel 3 located under the transfer gate electrode 9.

According to the first embodiment, the portion of the transfer channel 3 located under the transfer gate electrode 7 has a function of transferring the electrons stored in the PD portion 4 to the portion (electron storage portion 3a) of the transfer channel 3 located under the transfer gate electrode 8 when the ON-state (high-level) clock signal φ1 is supplied to the transfer gate electrode 7, while functioning as a photodiode isolation barrier dividing the PD portion 4 and the transfer channel 3 (electron storage portion 3a) from each other when the OFF-state (low-level) clock signal φ1 is supplied to the transfer gate electrode 7.

The portion of the transfer channel 3 located under the transfer gate electrode 9 has a function of transferring the electrons stored in the electron storage portion 3a to the electron multiplying portion 3b and transferring the electrons stored in the electron multiplying portion 3b to the electron storage portion 3a when the ON-state (high-level) clock signal 43 is supplied to the transfer gate electrode 9. When the OFF-state (low-level) clock signal φ3 is supplied to the transfer gate electrode 9, on the other hand, the portion of the transfer channel 3 located under the transfer gate electrode 9 functions as a charge transfer barrier dividing the electron storage portion 3a and the electron multiplying portion 3b from each other. In other words, the transfer gate electrode 9 is so supplied with the ON-state (high-level) clock signal 43 that the electrons stored in the electron storage portion 3a can be transferred to the electron multiplying portion 3b and the electrons stored in the electron multiplying portion 3b can be transferred to the electron storage portion 3a.

According to the first embodiment, the portion of the transfer channel 3 located under the readout gate electrode 11 has a function of transferring the electrons stored in the transfer channel 3 (electron multiplying portion 3b) to the FD region 5 when the ON-state (high-level) clock signal φ5 is supplied to the readout gate electrode 11, and a function of dividing the transfer channel 3 (electron multiplying portion 3b) and the FD region 5 from each other when the OFF-state (low-level) clock signal φ5 is supplied to the readout gate electrode 11. In other words, the readout gate electrode 11 is so supplied with the ON-state (high-level) clock signal φ5 that the electrons stored in the transfer channel 3 (electron multiplying portion 3b) can be transferred to the FD region 5. In other words, the CMOS image sensor according to the first embodiment is so formed that the portions of the transfer channel 3 located under the transfer gate electrode 7 and the readout gate electrode 11 respectively have the lowest potentials when the OFF-state (low-level) clock signals φ1, φ2, φ3, φ4 and φ5 are supplied to the transfer gate electrodes 7, 8 and 9, the multiplier gate electrode 10 and the readout gate electrode 11 respectively.

Figure 5:
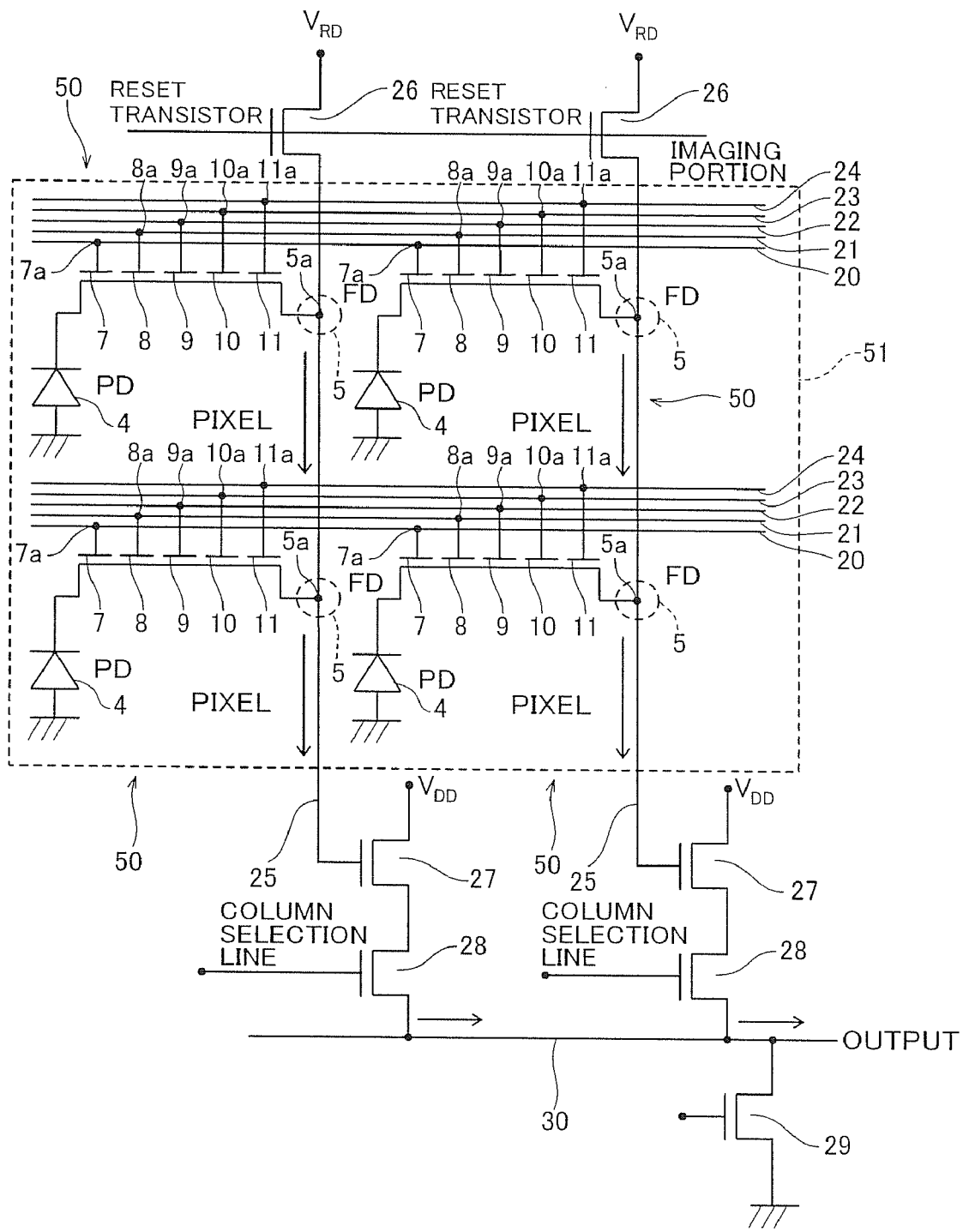
FIG. 5 is a circuit diagram showing the circuit structure of the CMOS image sensor according to the first embodiment of the present invention.

As shown in FIG. 5, the source of a reset transistor 26 is connected to a first end of the signal line 25 corresponding to each column. A reset signal is supplied to the gate of the reset transistor 26, while a reset voltage $V_{RD}$ (about 5 V) is applied to the drain thereof. Thus, the reset transistor 26 has a function of resetting the signal line 25 to the reset voltage $V_{RD}$ (about 5 V) after data is read from each pixel 50 while holding the FD region 5 in an electrically floating state when the data is read from the pixel 50.

A second end of the signal line 25 corresponding to each column is connected to the gate of a voltage conversion transistor 27. The source of the voltage conversion transistor 27 is connected to the drain of a selection transistor 28, and a power supply voltage $V_{DD}$ is supplied to the drain thereof. A column selection line is connected to the gate of the selection transistor 28, and an output line 30 is connected to the source thereof. The drain of a transistor 29 is connected to the output line 30. The source of the transistor 29 is grounded, and a prescribed voltage for driving the transistor 29 as a constant current source is applied to the gate thereof. The voltage conversion transistor 27 corresponding to each column and the transistor 29 constitute a source follower circuit.

A read operation of the CMOS image sensor according to the first embodiment is now described with reference to FIG. 5.

First, a high-level signal is supplied to the wiring layer 22 of a prescribed row to bring the transfer gate electrode 9 of each pixel 50 forming the prescribed row of the imaging portion 51 into an ON state, while a low-level signal is supplied to the wiring layer 21 of the prescribed row to bring the transfer gate electrode 8 of each pixel 50 forming the prescribed row of the imaging portion 51 into an OFF state. Thus, the electrons stored in the portion (electron storage portion 3a) of the transfer channel 3 located under the transfer gate electrode 8 are transferred to the portion of the transfer channel 3 located under the transfer gate electrode 9. Then, a high-level signal is supplied to the wiring layer 23 of the prescribed row to bring the multiplier gate electrode 10 of each pixel 50 forming the prescribed row of the imaging portion 51 into an ON state, while a low-level signal is supplied to the wiring layer 22 of the prescribed row to bring the transfer gate electrode 9 of each pixel 50 forming the prescribed row of the imaging portion 51 into an OFF state. Thus, the electrons having been transferred to the portion of the transfer channel 3 located under the transfer gate electrode 9 are transferred to the portion (electron multiplying portion 3b) of the transfer channel 3 located under the multiplier gate electrode 10. Then, a high-level signal is supplied to the wiring layer 24 of the prescribed row to bring the readout gate electrode 11 of each pixel 50 forming the prescribed row of the imaging portion 51 into an ON state, while a low-level signal is supplied to the wiring layer 23 of the prescribed row to bring the multiplier gate electrode 10 of each pixel 50 forming the prescribed row of the imaging portion 51 into an OFF state. Thus, the electrons stored in the transfer channel 3 (electron multiplying portion 3b) in each pixel 50 forming the prescribed row are read on the FD region 5 of each pixel 50. Thus, a potential responsive to a signal of each pixel 50 forming the prescribed row appears on the signal line 25 corresponding to each column. In this state, the selection transistor 28 is in an OFF state, and hence no current flows in the source follower circuit constituted of the voltage conversion transistor 27 and the transistor 29.

Then, high-level signals are successively supplied to the column selection lines, to successively bring the selection transistors 28 into ON states. Thus, a current successively flows through the voltage conversion transistor 27 and the selection transistor 28 corresponding to each column and the transistor 29, whereby a signal is output every pixel 50 in response to the ON state of each voltage conversion transistor 27 (gate potential of each voltage conversion transistor 27 (potential of the signal line 25)). After all outputs are completed, a high-level reset signal is supplied to the gate of the reset transistor 26 to bring the reset transistor 26 into an ON state, thereby resetting the potential of the signal line 25 to about 5 V. The CMOS image sensor according to the first embodiment reads data by repeating this operation.

An electron transferring operation of the CMOS image sensor according to the first embodiment is now described with reference to FIGS. 6 and 7.

Figure 6:
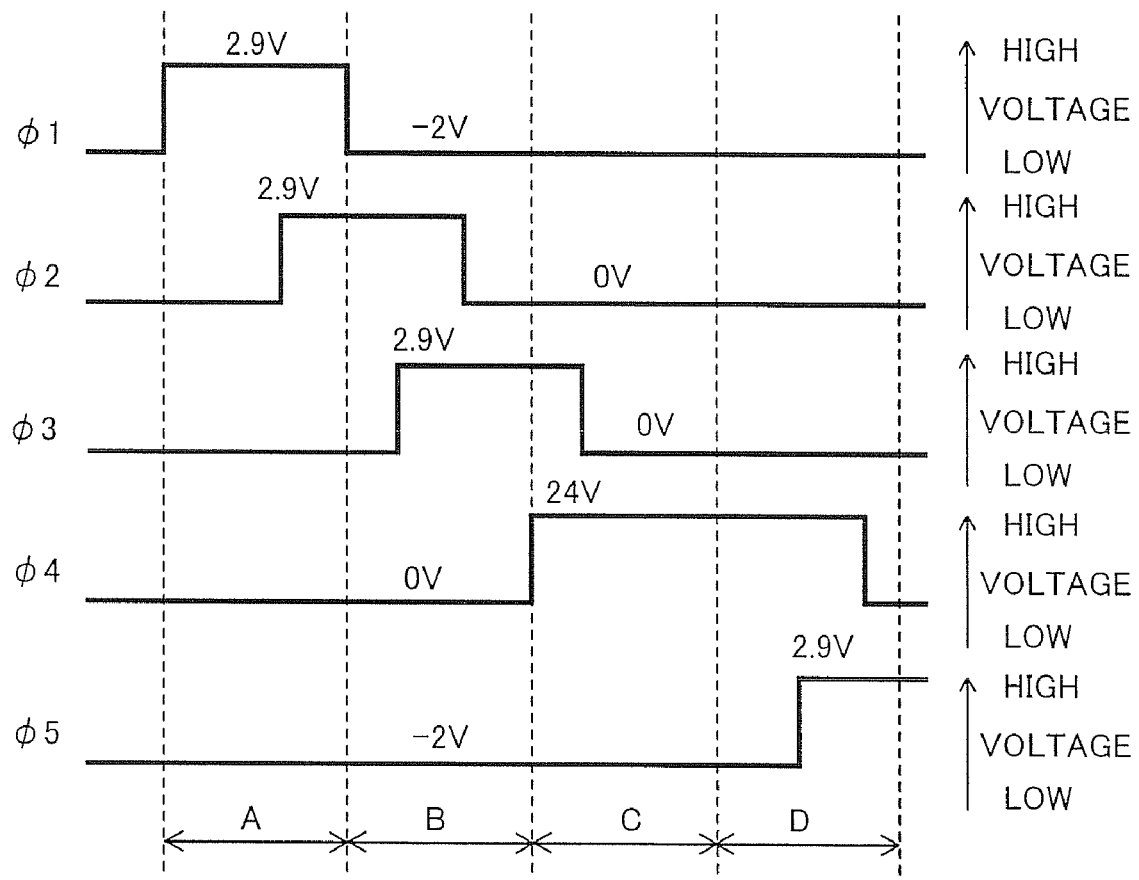
FIG. 6 is a signal waveform diagram for illustrating an electron transferring operation of the CMOS image sensor according to the first embodiment of the present invention.
Figure 7:
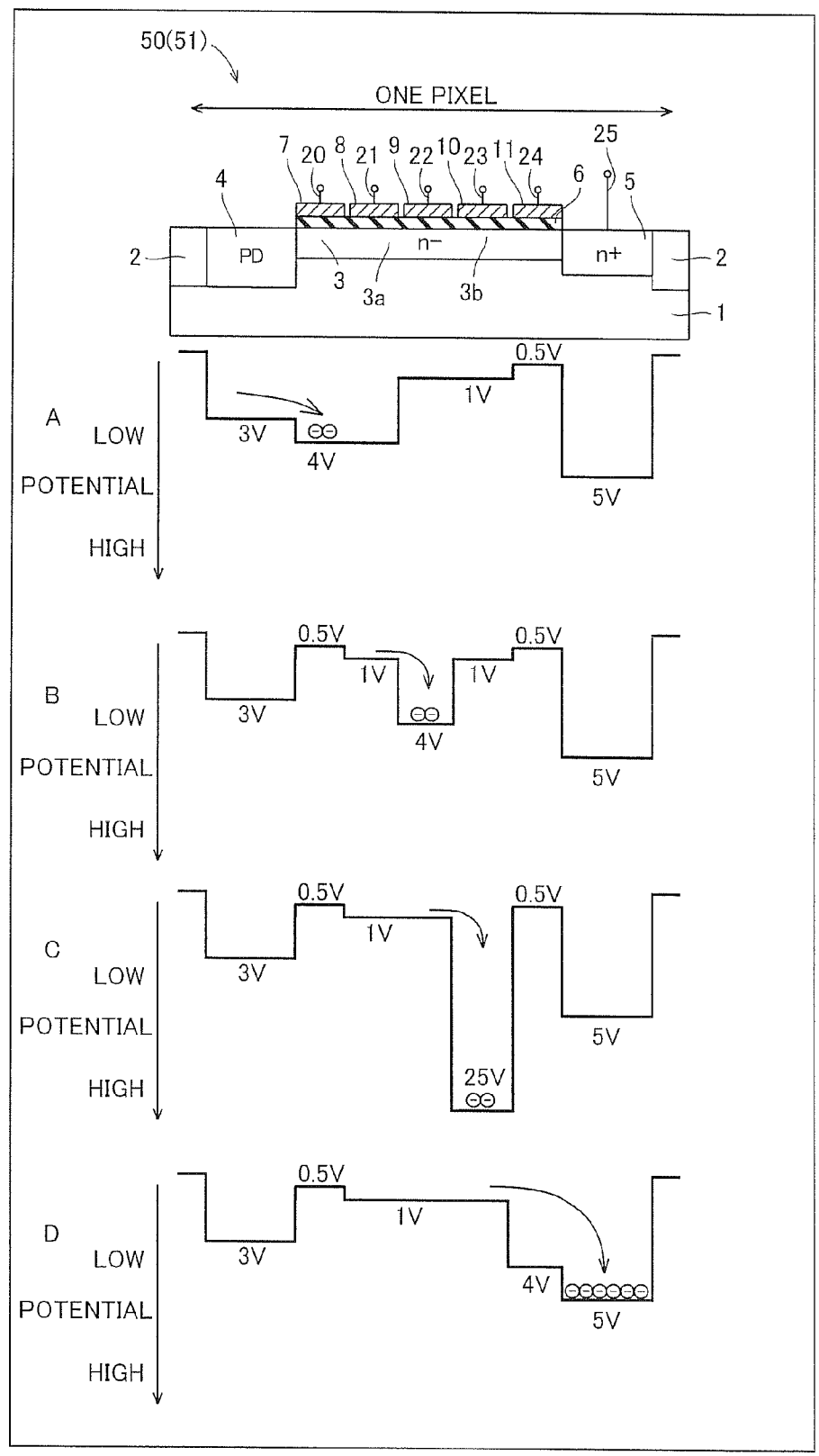
FIG. 7 is a potential diagram for illustrating the electron transferring operation of the CMOS image sensor according to the first embodiment of the present invention.

In a period A shown in FIG. 6, the transfer gate electrode 7 is brought into an ON state, thereby controlling the portion of the transfer channel 3 located under the transfer gate electrode 7 to a potential of about 4 V, as shown in FIG. 7. At this time, the PD portion 4 is controlled to the potential of about 3 V, and hence the electrons generated by and stored in the PD portion 4 are transferred from the PD portion 4 to the portion of the transfer channel 3 located under the transfer gate electrode 7. Then, the transfer gate electrode 8 is brought into an ON state and the transfer gate electrode 7 is thereafter brought into an OFF state to control the portion of the transfer channel 3 located under the transfer gate electrode 8 to a potential of about 4 V and thereafter control the portion of the transfer channel 3 located under the transfer gate electrode 7 to a potential of about 0.5 V. Thus, the electrons having been transferred to the portion of the transfer channel 3 located under the transfer gate electrode 7 are transferred to the portion (electron storage portion 3a) of the transfer channel 3 located under the transfer gate electrode 8. At this time, the transfer gate electrode 7 is so brought into the OFF state as to control the portion of the transfer channel 3 located under the transfer gate electrode 7 to the low potential of about 0.5 V. Thus, the electrons transferred from the PD portion 4 are temporarily stored in the portion (electron storage portion 3a) of the transfer channel 3 located under the transfer gate electrode 8 in the period A. Thereafter an electron multiplying operation described alter is repeated a plurality of times (about 400 times, for example). Consequently, the electrons transferred from the PD portion 4 are multiplied to about 2000 times.

Then, in a period B shown in FIG. 6, the transfer gate electrode 9 is brought into an ON state and the transfer gate electrode 8 is thereafter brought into an OFF state to control the portion of the transfer channel 3 located under the transfer gate electrode 9 to a potential of about 4 V and to thereafter control the portion of the transfer channel 3 located under the transfer gate electrode 8 to a potential of about 1 V, as shown in FIG. 7. Therefore, the electrons stored in the portion of the transfer channel 3 located under the transfer gate electrode 8 are transferred to the portion, controlled to the potential (about 4 V) higher than the potential (about 1 V) of the portion of the transfer channel 3 located under the transfer gate electrode 8, of the transfer channel 3 located under the transfer electrode 9.

Then, in a period C shown in FIG. 6, the multiplier gate electrode 10 is brought into an ON state and the transfer gate electrode 9 is thereafter brought into an OFF state to control the portion (electron multiplying portion 3b) of the transfer channel 3 located under the multiplier gate electrode 10 to a high potential of about 25 V and to thereafter control the portion of the transfer channel 3 located under the transfer gate electrode 9 to a potential of about 1 V, as shown in FIG. 7. Therefore, the electrons having been transferred to the portion of the transfer channel 3 located under the transfer gate electrode 9 are transferred to the portion, controlled to the potential (about 25 V) higher than the potential (about 1 V) of the portion of the transfer channel 3 located under the transfer gate electrode 9, of the transfer channel 3 located under the multiplier gate electrode 10. According to the first embodiment, the readout gate electrode 11 adjacent to the multiplier gate electrode 10 is in an OFF state when the electrons are transferred to the portion of the transfer channel 3 located under the multiplier gate electrode 10. Thus, the portion of the transfer channel 3 located under the readout gate electrode 11 maintains the state controlled to the low potential of about 0.5 V, whereby the difference between this potential and the potential (about 25 V) of the portion of the transfer channel 3 located under the multiplier gate electrode 10 is maximized to about 24.5 V in the transfer channel 3.

Then, in a period D shown in FIG. 6, the readout gate electrode 11 is brought into an ON state and the multiplier gate electrode 10 is thereafter brought into an OFF state while the electrons are stored in the portion (electron multiplying portion 3b) of the transfer channel 3 located under the multiplier gate electrode 10 to control the portion of the transfer channel 3 located under the readout gate electrode 11 to a potential of about 4 V and to thereafter control the portion of the transfer channel 3 located under the multiplier gate electrode 10 to a potential of about 1 V, as shown in FIG. 7. Therefore, the electrons stored in the portion of the transfer channel 3 located under the multiplier gate electrode 10 are transferred to the FD region 5, controlled to the potential (about 5 V) higher than the potential (about 1 V) of the portion of the transfer channel 3 located under the multiplier gate electrode 10, through the portion, controlled to the potential of about 4 V, of the transfer channel 3 located under the readout gate electrode 11.

The electron multiplying operation of the CMOS image sensor according to the first embodiment is now described with reference to FIGS. 7 to 11.

Figure 8:
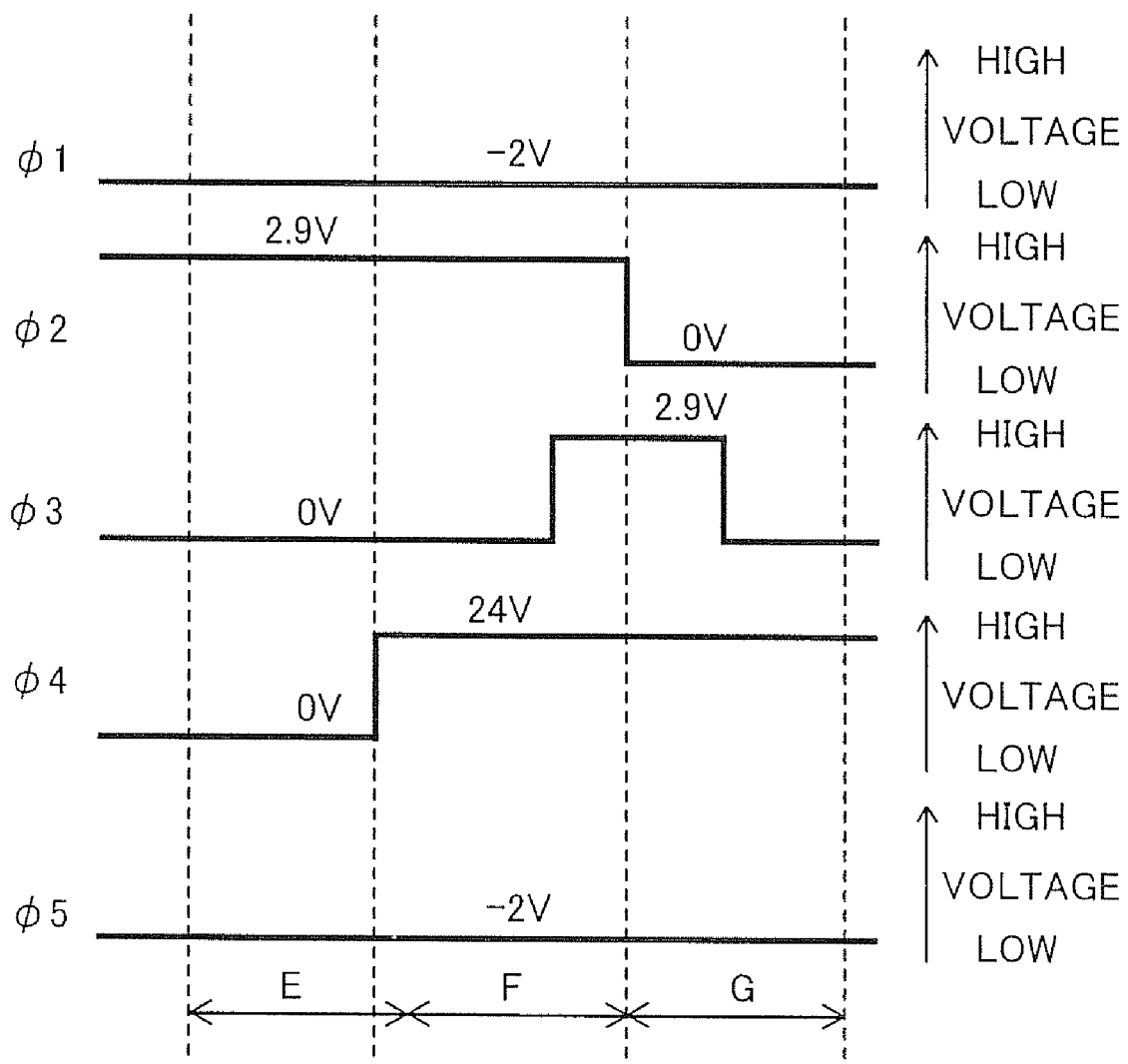
FIG. 8 is a signal waveform diagram for illustrating an electron multiplying operation of the CMOS image sensor according to the first embodiment of the present invention.
Figure 9:
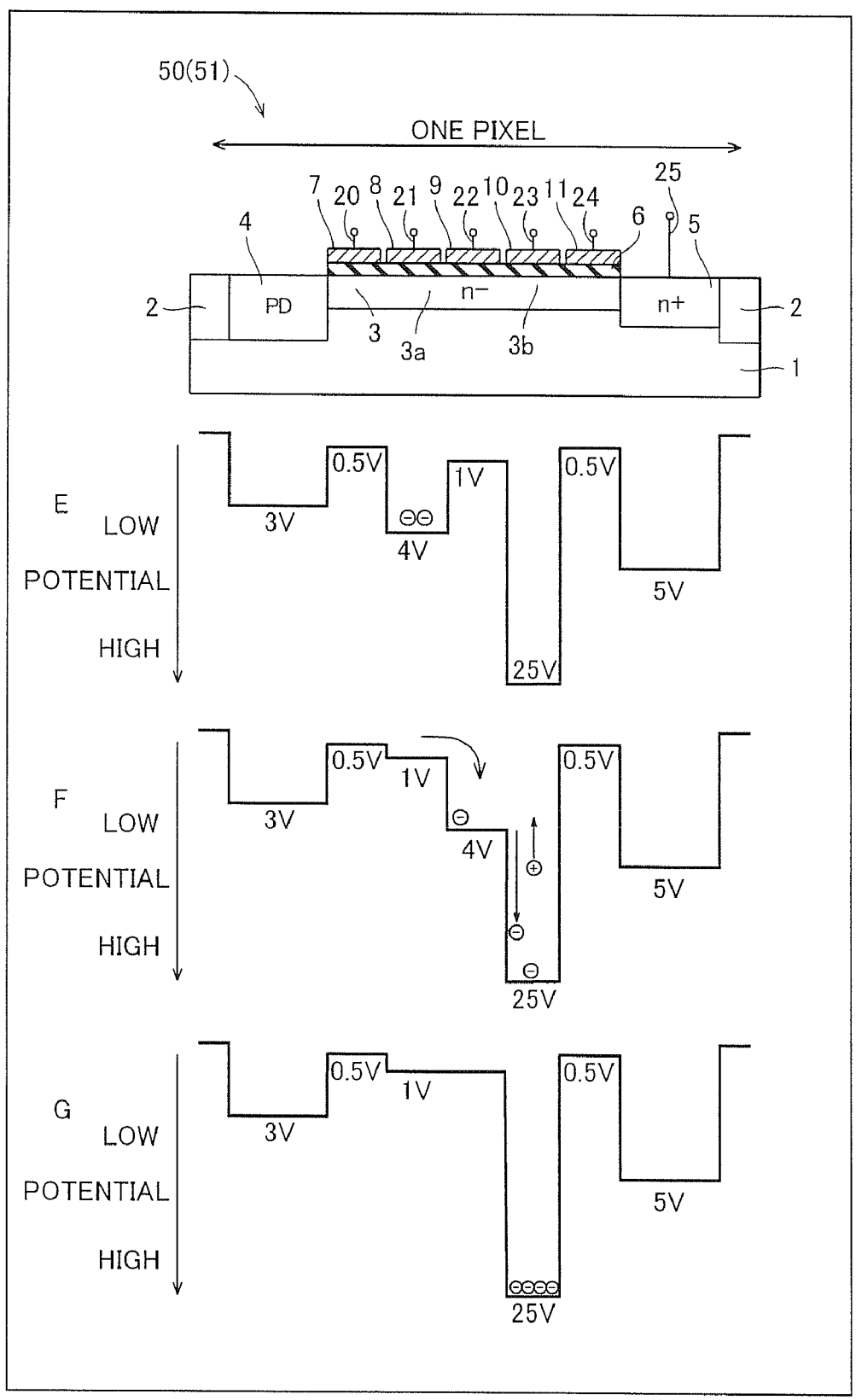
FIG. 9 is a potential diagram for illustrating the electron multiplying operation of the CMOS image sensor according to the first embodiment of the present invention.

After the operation of transferring the electrons to the portion of the transfer channel 3 located under the transfer gate electrode 8 in the period A shown in FIG. 7, the multiplier gate electrode 10 is bought into an ON state while the portion of the transfer channel 3 located under the transfer gate electrode 8 holds the electrons in a period E shown in FIG. 8, as shown in FIG. 9.

Then, in a period F shown in FIG. 8, the transfer gate electrode 9 is brought into an ON state and the transfer gate electrode 8 is thereafter brought into an OFF state to control the portion of the transfer channel 3 located under the transfer gate electrode 8 to a potential of about 1 V and to control the portion of the transfer channel 3 located under the transfer gate electrode 9 to a potential of about 4 V, as shown in FIG. 9. Therefore, the electrons stored in the portion (electron storage portion 3a) of the transfer channel 3 located under the transfer gate electrode 8 are transferred to the portion (electron multiplying portion 3b), controlled to the high potential (about 25 V), of the transfer channel 3 located under the multiplier gate electrode 10 through the portion (about 4 V) of the transfer channel 3 located under the transfer gate electrode 9. The electrons transferred to the portion (electron multiplying portion 3b) of the transfer channel 3 located under the multiplier gate electrode 10 obtain energy from the high electric field when moving through the boundary between the portions of the transfer channel 3 located under the multiplier gate electrode 10 and the transfer gate electrode 9 respectively. The electrons having high energy collide with silicon atoms to generate electrons and holes. Thereafter the electrons generated by the impact ionization are stored in the portion (electron multiplying portion 3b) of the transfer channel 3 located under the multiplier gate electrode 10 by the electric field.

Then, in a period G shown in FIG. 8, the transfer gate 9 is brought into an OFF state to control the portion of the transfer channel 3 located under the transfer gate electrode 9 to a potential of about 1 V, as shown in FIG. 9.

Figure 10:
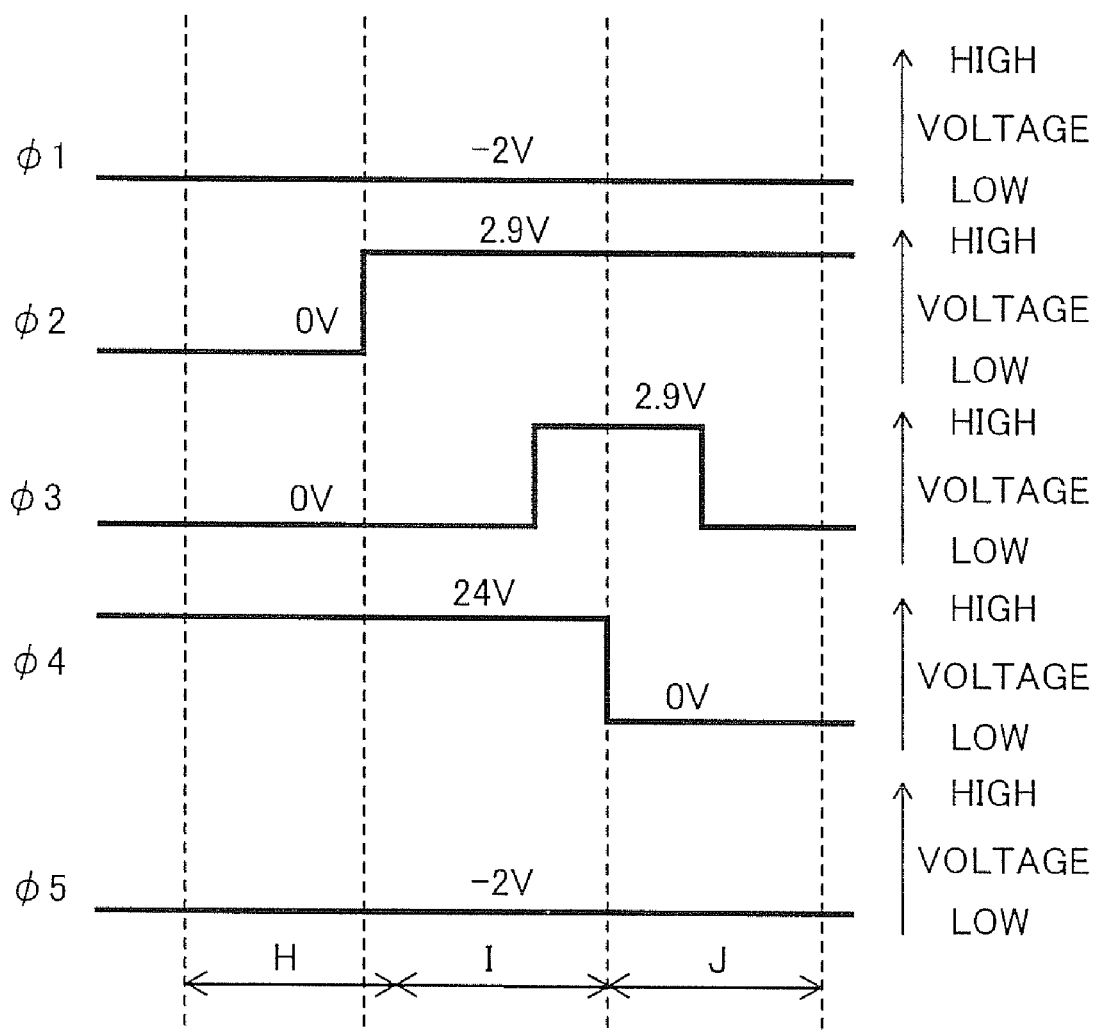
FIG. 10 is another signal waveform diagram for illustrating the electron multiplying operation of the CMOS image sensor according to the first embodiment of the present invention.
Figure 11:
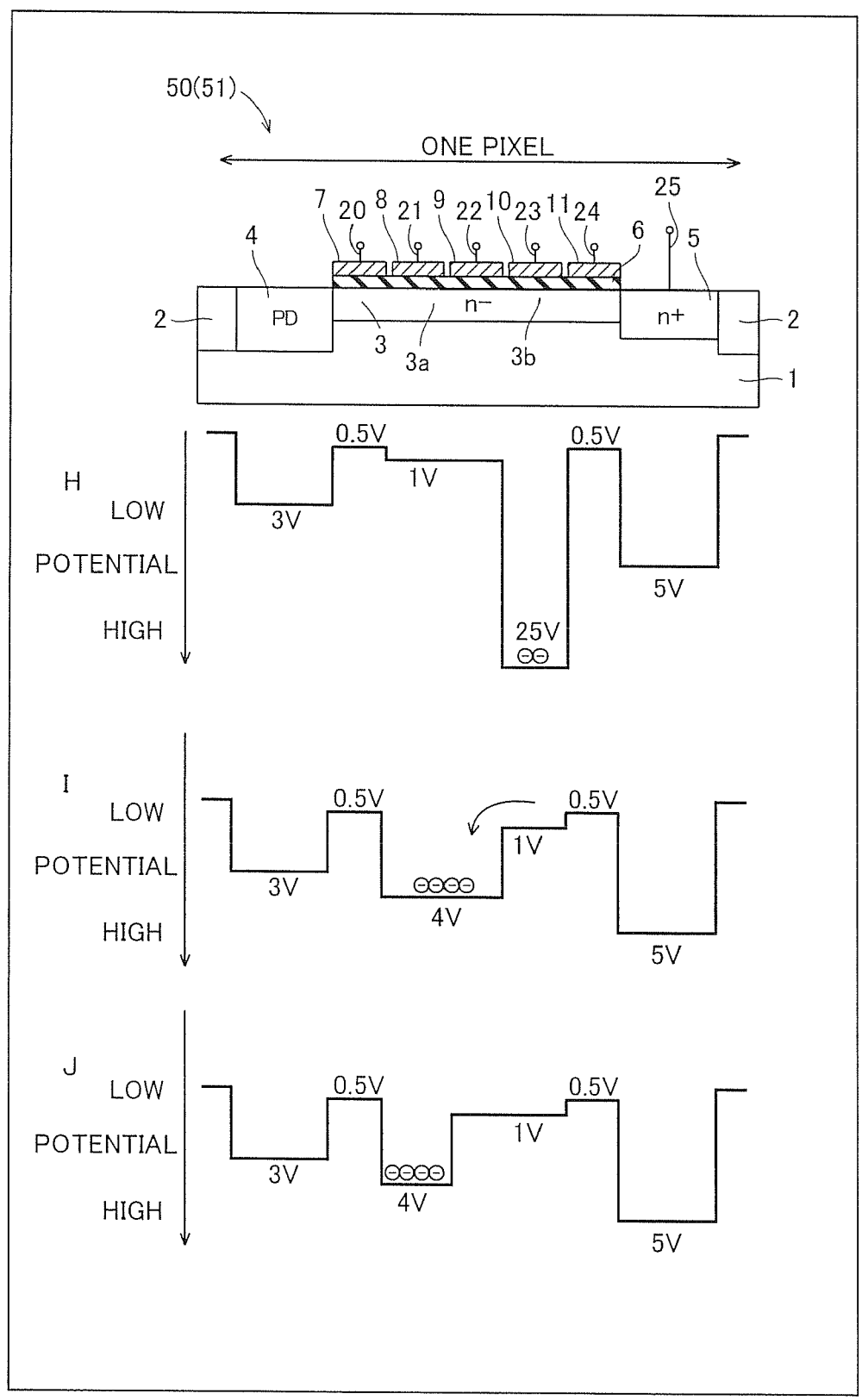
FIG. 11 is another potential diagram for illustrating the electron multiplying operation of the CMOS image sensor according to the first embodiment of the present invention.

Then, in a period H shown in FIG. 10, the transfer gate electrode 9 is brought into an ON state and the transfer gate electrode 8 is thereafter brought into an ON state from the state where the portion (electron multiplying portion 3b) of the transfer channel 3 located under the multiplier gate electrode 10 holds the electrons, as shown in FIG. 11. Thus, the portions of the transfer channel 3 located under the transfer gate electrodes 9 and 8 respectively are successively controlled to potentials of about 4 V. From this state, the multiplier gate electrode 10 is brought into an OFF state, to control the potential of the transfer channel 3 located under the multiplier gate electrode 10 to a potential of about 1 V. Thus, the electrons having been stored in the portion (electron multiplying portion 3b) of the transfer channel 3 located under the multiplier gate electrode 10 are transferred to the portions (having the potentials of about 4 V) of the transfer channel 3 located under the transfer gate electrodes 8 and 9 respectively.

Then, in a period J shown in FIG. 10, the transfer gate electrode 9 is brought into an OFF state to control the potential of the portion of the transfer channel 3 located under the transfer gate electrode 9 to a potential of about 1 V, as shown in FIG. 11. Thus, the electrons are transferred to the portion (electron storage portion 3a) of the transfer channel 3 located under the transfer gate electrode 8. Thereafter the CMOS image sensor repeats the multiplying operation in the aforementioned periods E to J a plurality of times (about 400 times, for example), thereby multiplying the electrons transferred from the PD portion 4 to about 2000 times.

According to the first embodiment, as hereinabove described, the portions of the transfer channel 3 located under the transfer gate electrode 7 and the readout gate electrode 11 respectively are controlled to the potentials (about 0.5 V) lower than those of the portions of the transfer channel 3 located under the transfer gate electrodes 8 and 9 and the multiplier gate electrode 10 respectively in the electron transferring operation and the electron multiplying operation, so that the charge barriers of the portions of the transfer channel 3 located under the transfer gate electrode 7 and the readout gate electrode 11 respectively are higher than those of the portions of the transfer channel 3 located under the transfer gate electrodes 8 and 9 and the multiplier gate electrode 10 respectively. In the electron transferring operation and the electron multiplying operation, therefore, the electrons can be inhibited from leaking toward the PD portion 4 and the FD region 5 over barriers (charge barriers) resulting from the high charge barriers formed in the portions of the transfer channel 3 located under the transfer gate electrode 7 and the readout gate electrode 11 respectively. Thus, the number of the transferred electrons can be reliably prevented from dispersion. Consequently, the CMOS image sensor can correctly read data. Further, the electron transferring operation and the electron multiplying operation are performed in the region held between high barriers (charge barriers), whereby the electrons can be more reliably inhibited from leaking toward the PD portion 4 and the FD region 5.

According to the first embodiment, the transfer gate electrode 9 for transferring electrons is provided between the transfer gate electrode 8 and the multiplier gate electrode 10 and the electron multiplying operation is performed by controlling the transfer gate electrodes 8 and 9 to transfer the electrons stored in the portion (electron storage portion 3a) of the transfer channel 3 located under the transfer gate electrode 8 to the portion (electron multiplying portion 3b) of the transfer channel 3 located under the multiplier gate electrode 10 while controlling the portion (electron multiplying portion 3b) of the transfer channel 3 located under the multiplier gate electrode 10 to the high potential of about 25 V, whereby the electrons stored in the electron storage portion 3a can be easily transferred to the electron multiplying portion 3b to be multiplied therein. Further, the electron transferring operation is performed by controlling the transfer gate electrodes 8 and 9 to transfer the electrons multiplied by the portion (electron multiplying portion 3b) of the transfer channel 3 located under the multiplier gate electrode 10 to the portion (electron storage portion 3a) of the transfer channel 3 located under the transfer gate electrode 8, whereby the electrons multiplied by the electron multiplying portion 3b can be easily transferred to the electron storage portion 3a to be stored therein. In addition, the electron multiplying operation and the electron transferring operation are so alternately repeated that the electron multiplying operation can be performed a plurality of times (about 400 times, for example), whereby the electron multiplication factor can be improved. Thus, the number of the electrons transferred from the PD portion 4 can be increased to about 2000 times.

According to the first embodiment, the readout gate electrode 11 corresponding to the portion of the transfer channel 3 having the highest charge barrier in an OFF state is arranged on the position adjacent to the multiplier gate electrode 10 for multiplying electrons, whereby the electrons can be easily inhibited from leaking toward the FD region 5 due to the high charge barrier of the portion of the transfer channel 3 located under the readout gate electrode 11 also when a high voltage is applied to the portion of the transfer channel 3 located under the multiplier gate electrode 10 in the electron multiplying operation.

According to the first embodiment, the ON-state voltage (about 2.9 V) applied to the transfer gate electrode 7 when transferring the electrons from the PD portion 4 to the portion of the transfer channel 3 located under the transfer gate electrode 7 and the ON-state voltage (about 2.9 V) applied to the readout gate electrode 11 when transferring the electrons to the FD region 5 are substantially equalized with the ON-state voltages (about 2.9 V) applied to the transfer gate electrodes 8 and 9 for transferring the electrons. According to this structure, the electron transferring operation can be easily controlled due to the substantially equal ON-state voltages applied to the transfer gate electrodes 7, 8 and 9 and the readout gate electrode 11.

Second Embodiment

In a CMOS image sensor according to a second embodiment of the present invention, the potentials of portions of a transfer channel 3 located under a transfer gate electrode 7 and a readout gate electrode 11 respectively are controlled to be different from each other and lower than those of portions of the transfer channel 3 located under transfer gate electrodes 8 and 9 and a multiplier gate electrode 10 respectively when OFF-state (low-level) clock signals φ1 and φ5 are supplied to the transfer gate electrode 7 and the readout gate electrode 11 respectively, dissimilarly to the aforementioned first embodiment.

Figure 12:
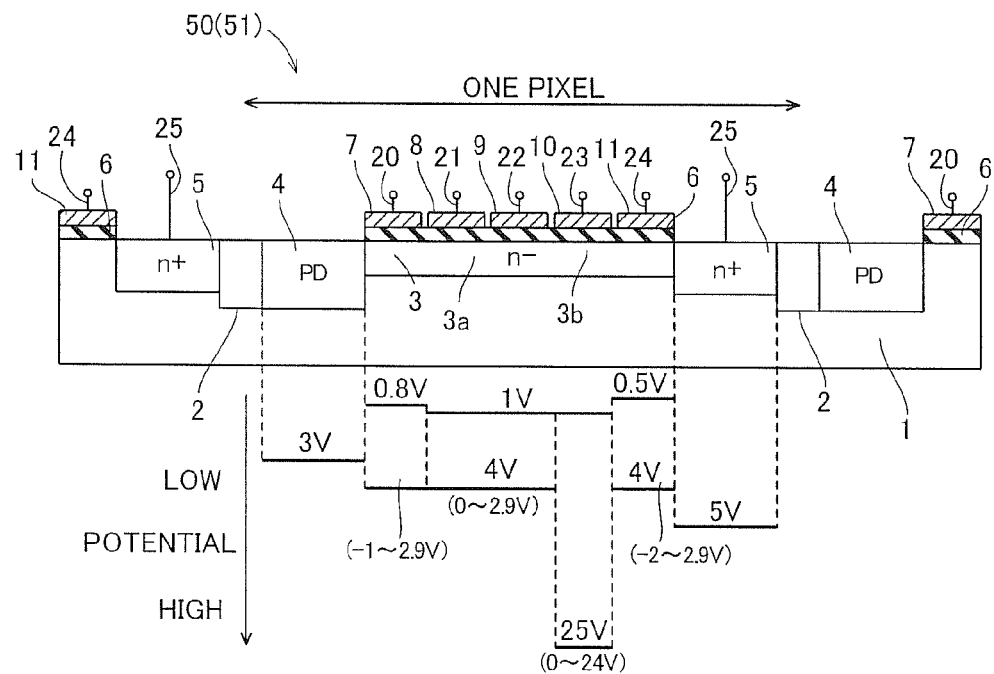
FIG. 12 is a sectional view showing the structure of a CMOS image sensor according to a second embodiment of the present invention.
Figure 13:
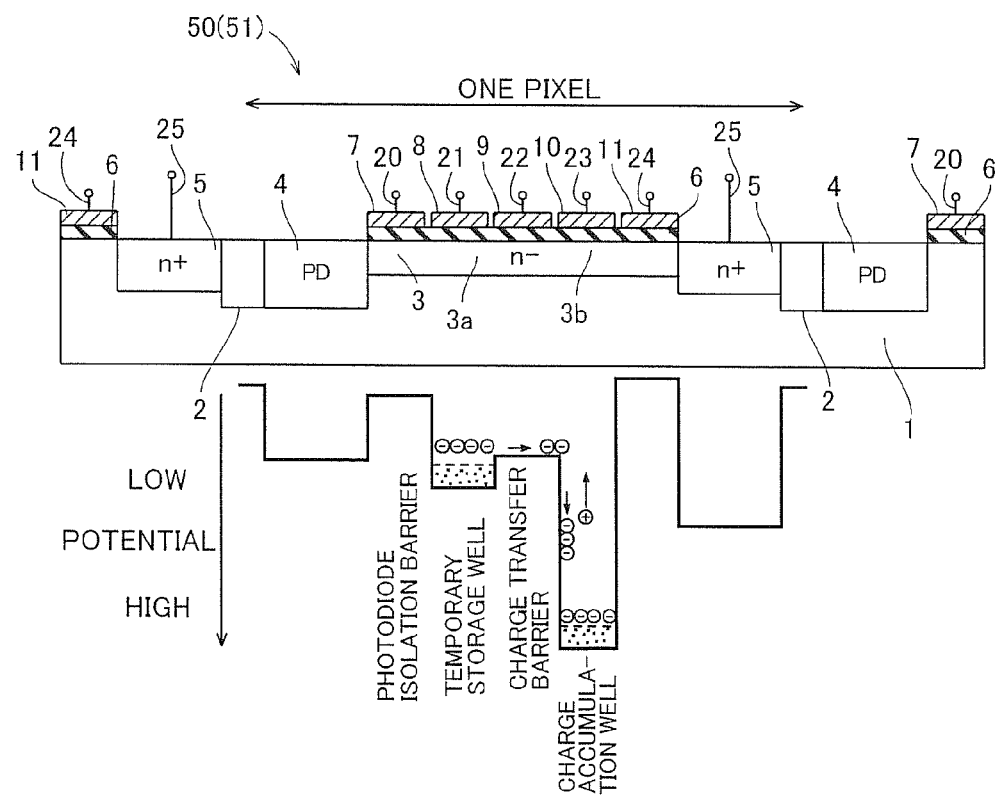
FIG. 13 is a potential diagram in the CMOS image sensor according to the second embodiment of the present invention.

According to the second embodiment, voltages of about 0 V are applied to the transfer gate electrodes 8 and 9 and the multiplier gate electrode 10 when OFF-state (low-level) clock signals φ2, φ3 and φ4 are supplied to the transfer gate electrodes 8 and 9 and the multiplier gate electrode 10 through wiring layers 21, 22 and 23 respectively, as shown in FIGS. 12 and 13. At this time, the portions of the transfer channel 3 located under the transfer gate electrodes 8 and 9 and the multiplier gate electrode 10 respectively are controlled to potentials of about 1 V. When the OFF-state (low-level) clock signals φ1 and φ5 are supplied to the transfer gate electrode 7 and the readout gate electrode 11 through wiring layers 20 and 24 respectively, voltages of about −1 V and about −2 V are applied to the transfer gate electrode 7 and the readout gate electrode 11 respectively. At this time, the portions of the transfer channel 3 located under the transfer gate electrode 7 and the readout gate electrode 11 respectively are controlled to potentials of about 0.8 V and about 0.5 V respectively. The remaining structure and operations of the CMOS image sensor according to the second embodiment are similar to those of the CMOS image sensor according to the first embodiment.

According to the second embodiment, as hereinabove described, the potentials of the portions of the transfer channel 3 located under the transfer gate electrode 7 and the readout gate electrode 11 respectively are controlled to be lower than those of the portions of the transfer channel 3 located under the transfer gate electrodes 8 and 9 and the multiplier gate electrode 10 respectively and the potential of the portion of the transfer channel 3 located under the readout gate electrode 11 is controlled to be lower than that of the portion of the transfer channel 3 located under the transfer gate electrode 7 in an electron transferring operation for transferring electrons from the portion (electron multiplying portion 3b) of the transfer channel 3 located under the multiplier gate electrode 10 to the portion (electron storage portion 3a) of the transfer channel 3 located under the transfer gate electrode 8 and an electron multiplying operation for transferring the electrons from the portion (electron storage portion 3a) of the transfer channel 3 located under the transfer gate electrode 8 to the portion (electron multiplying portion 3b) of the transfer channel 3 located under the multiplier gate electrode 10. Thus, the readout gate electrode 11 corresponding to the portion of the transfer channel 3 having a high charge barrier is arranged between the portion (electron multiplying portion 3b) of the transfer channel 3 located under the multiplier gate electrode 10 having a remarkably fluctuating potential and an FD region 5, whereby the electrons can be inhibited from leaking toward the FD region 5 over a charge barrier formed in the portion of the transfer channel 3 located under the readout gate electrode 11 in the electron transferring operation and the electron multiplying operation. Further, the potential of the portion of the transfer channel 3 located under the transfer gate electrode 7 is also lower than those of the portions of the transfer channel 3 located under the transfer gate electrodes 8 and 9 and the multiplier gate electrode 10 respectively, whereby the electrons can be inhibited from leaking toward a PD portion 4 over a charge barrier formed in the portion of the transfer channel 3 located under the transfer gate electrode 7.

The remaining effects of the second embodiment are similar to those of the aforementioned first embodiment.

Third Embodiment

In a CMOS image sensor according to a third embodiment of the present invention, the gate length of a readout gate electrode 11 is rendered larger than those of the remaining gate electrodes in a structure similar to that of the CMOS image sensor according to the aforementioned first embodiment.

Figure 14:
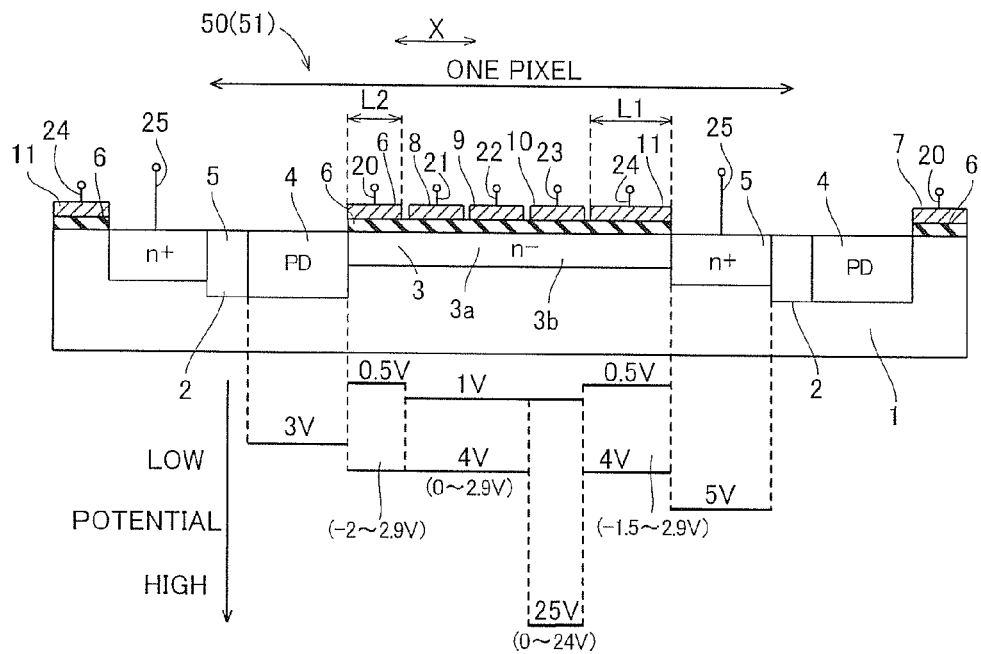
FIG. 14 is a sectional view showing the structure of a CMOS image sensor according to a third embodiment of the present invention.
Figure 15:
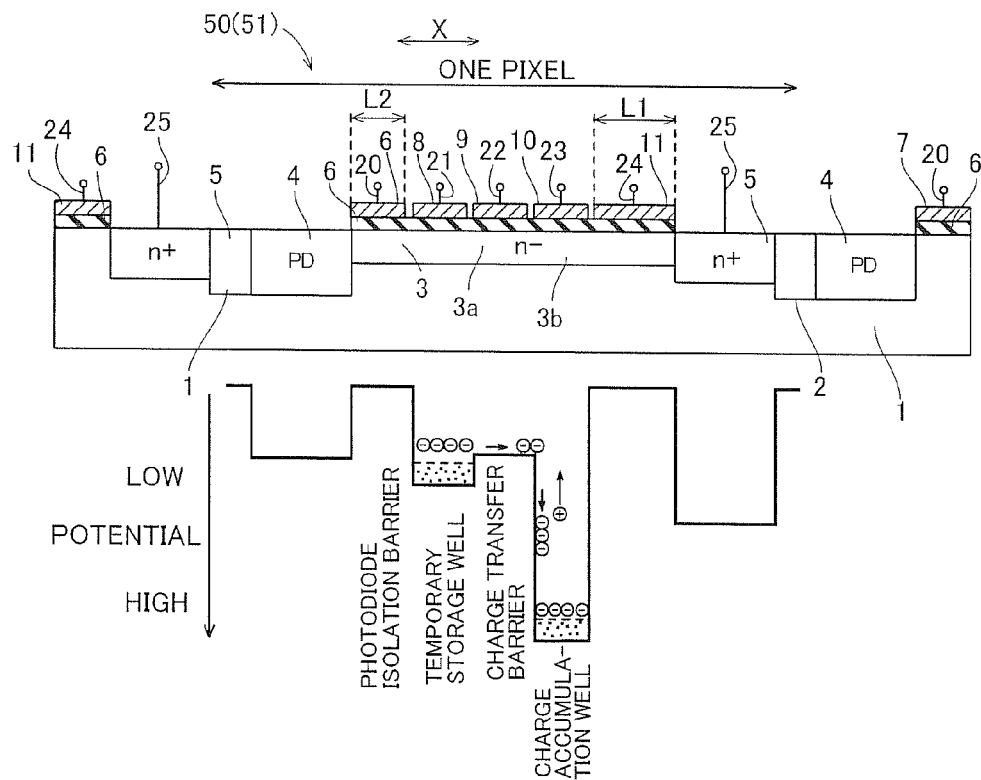
FIG. 15 is a potential diagram in the CMOS image sensor according to the third embodiment of the present invention.

According to the third embodiment, the gate length (L1 in FIG. 14) of the readout gate electrode 11 is rendered larger than those (L2 in FIG. 14) of the remaining gate electrodes other than the readout gate electrode 11, as shown in FIGS. 14 and 15. According to the third embodiment, voltages of about −2 V and about −1.5 V are applied to a transfer gate electrode 7 and the readout gate electrode 11 respectively when OFF-state (low-level) clock signals φ1 and φ5 are applied to the transfer gate electrode 7 and the readout gate electrode 11 through wiring layers 20 and 24 respectively. At this time, portions of a transfer channel 3 located under the transfer gate electrode 7 and the readout gate electrode 11 respectively are controlled to potentials of about 0.5 V. The remaining structure and operations of the CMOS image sensor according to the third embodiment are similar to those of the CMOS image sensor according to the first embodiment.

According to the third embodiment, as hereinabove described, the gate length (L1 in FIG. 14) of the readout gate electrode 11 is rendered larger than the gate lengths (L2 in FIG. 14) of the remaining gate electrodes other than the readout gate electrode 11, whereby the length (along arrow X in FIG. 14) of a barrier (charge barrier) resulting from the charge barrier of the portion of the transfer channel 3 located under the readout gate electrode 11 is also increased in proportion to the gate length of the readout gate electrode 11. In an electron multiplying operation and an electron transferring operation, therefore, electrons can be more reliably inhibited from leaking toward an FD region 5 over the barrier (charge barrier) formed in the portion of the transfer channel 3 located under the readout gate electrode 11 as compared with the aforementioned first embodiment. Thus, the number of electrons transferred from an electron storage portion 3a to the FD region 5 can be reliably prevented from dispersion. Consequently, the CMOS image sensor can correctly read data. Further, the readout gate electrode 11 having the largest gate length is so arranged on the position adjacent to a multiplier gate electrode 10 corresponding to a portion, having a remarkably fluctuating potential, of the transfer channel 3 that the electrons can be easily inhibited from leaking toward the FD region 5. Thus, the readout gate electrode 11 having the largest gate length and corresponding to the portion, exhibiting the lowest potential in an OFF state, of the transfer channel 3 is so arranged between the multiplier gate electrode 10 and the FD region 5 that the electrons can be reliably inhibited from leaking toward the FD region 5.

The remaining effects of the third embodiment are similar to those of the aforementioned first embodiment.

Fourth Embodiment

In a CMOS image sensor according to a fourth embodiment of the present invention, the positions of a transfer gate 8 and a multiplier gate electrode 10 are exchanged in a structure similar to that of the CMOS image sensor according to the aforementioned first embodiment.

Figure 16:
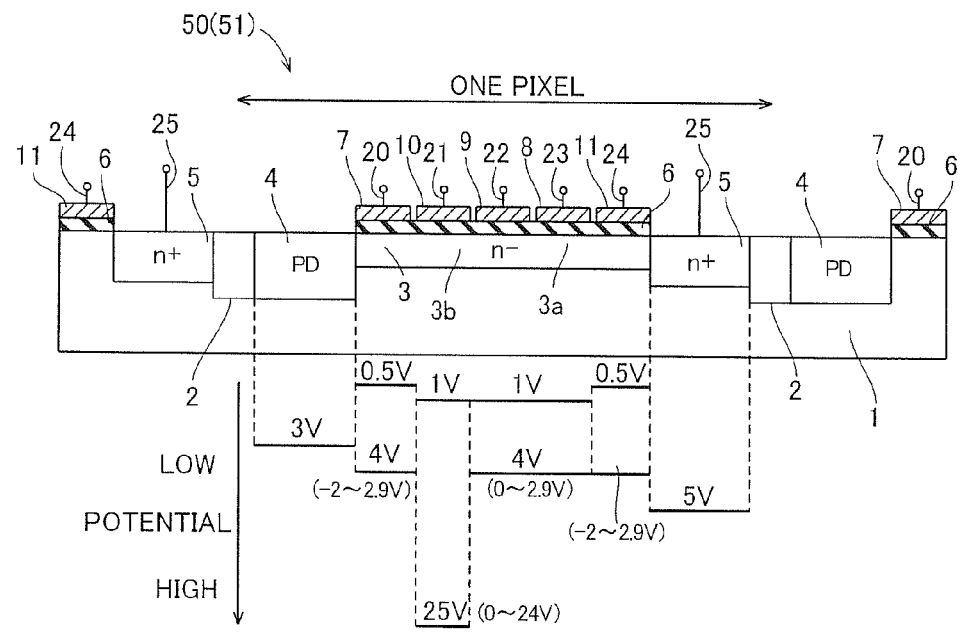
FIG. 16 is a sectional view showing the structure of a CMOS image sensor according to a fourth embodiment of the present invention.
Figure 17:
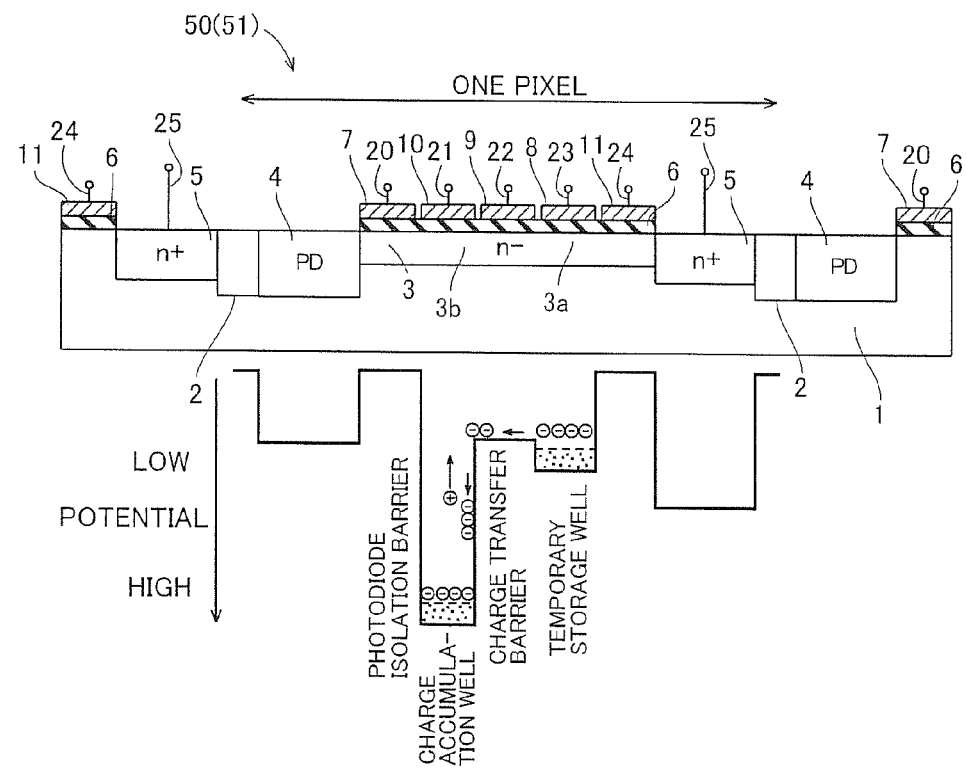
FIG. 17 is a potential diagram in the CMOS image sensor according to the fourth embodiment of the present invention.

According to the fourth embodiment, the transfer gate electrode 8 is provided between a transfer gate electrode 9 and a readout gate electrode 11 while the multiplier gate electrode 10 is provided on a side opposite to the transfer gate electrode 8 and the readout gate electrode 11 with respect to the transfer gate electrode 9, as shown in FIGS. 16 and 17. Following this, the positions of an electron storage portion 3a and an electron multiplying portion 3b in a transfer channel 3 are also reversed.

According to the fourth embodiment, as hereinabove described, the transfer gate electrode 8 is provided between the transfer gate electrode 9 and the readout gate electrode 11 and the multiplier gate electrode 10 is provided on the side opposite to the transfer gate electrode 8 and the readout gate electrode 11 with respect to the transfer gate electrode 9, whereby electrons can be transferred to an FD region 5 by changing a relatively low voltage (about 2.9 V) applied to the transfer gate electrode 8 when the CMOS image sensor reads data without transferring the electrons to the FD region 5 by changing a high voltage (about 24 V) applied to the multiplier gate electrode 10 for forming an electric field impact-ionizing the electrons. When the CMOS image sensor reads data, therefore, the potential of a portion of the transfer channel 3 located under the readout gate electrode 11 can be prevented from fluctuation resulting from change of a high potential (about 25 V) in a portion (electron multiplying portion 3b) of the transfer channel 3 located under the multiplier gate electrode 10, whereby the number of the electrons transferred to the FD region 5 can be more effectively prevented from dispersion. Consequently, the CMOS image sensor can correctly read data.

The remaining structure and operations of the CMOS image sensor according to the fourth embodiment are similar to those of the CMOS image sensor according to the first embodiment.

Fifth Embodiment

In a CMOS image sensor according to a fifth embodiment of the present invention, a structure similar to that of the CMOS image sensor according to the second embodiment is added to a structure similar to that of the CMOS image sensor according to the aforementioned fourth embodiment.

Figure 18:
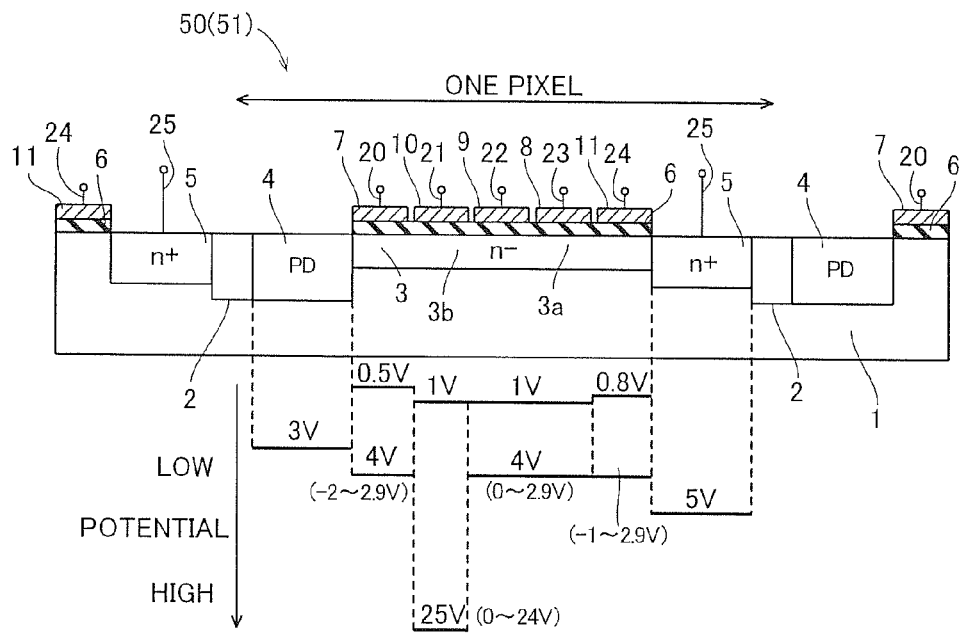
FIG. 18 is a sectional view showing the structure of a CMOS image sensor according to a fifth embodiment of the present invention.
Figure 19:
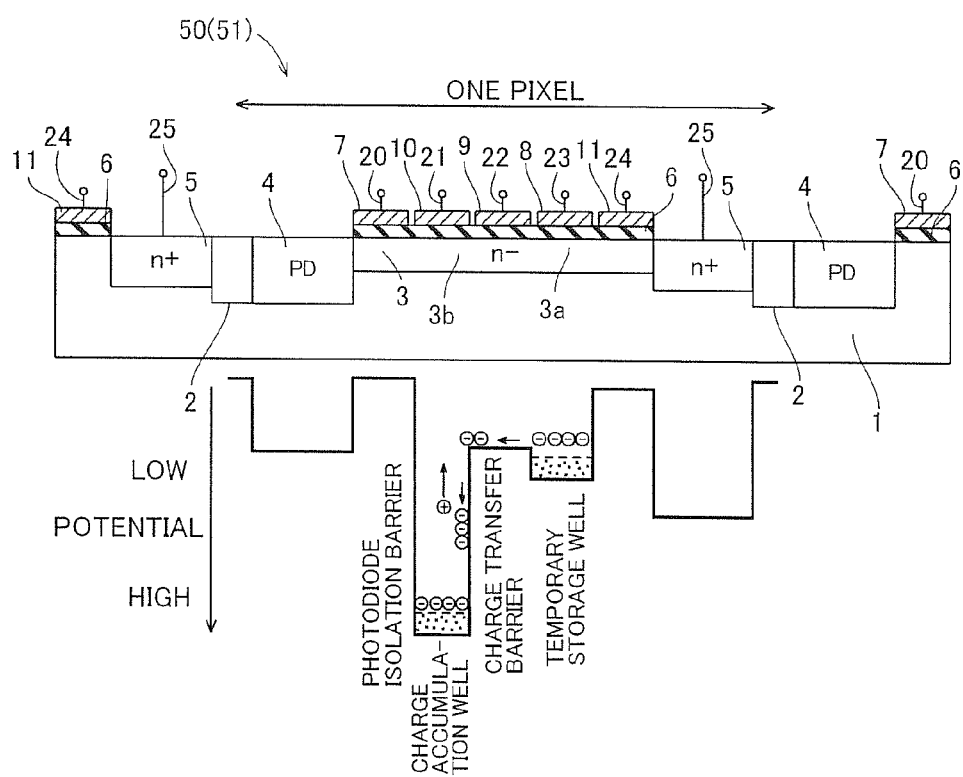
FIG. 19 is a potential diagram in the CMOS image sensor according to the fifth embodiment of the present invention.

According to the fifth embodiment, a transfer gate electrode 8 is provided between a transfer gate electrode 9 and a readout gate electrode 11 and a multiplier gate electrode 10 is provided on a side opposite to the transfer gate electrode 8 and the readout gate electrode 11 with respect to the transfer gate electrode 9 as shown in FIGS. 18 and 19, similarly to the fourth embodiment. According to the fifth embodiment, the potentials of portions of a transfer channel 3 located under a transfer gate electrode 7 and the readout gate electrode 11 respectively are controlled to be different from each other and lower (high charge barriers) than those of portions of the transfer channel 3 located under the transfer gate electrodes 8 and 9 and the multiplier gate electrode 10 respectively when OFF-state (low-level) clock signals φ1 and φ5 are supplied to the transfer gate electrode 7 and the readout gate electrode 11 respectively. According to the fifth embodiment, the potential of the portion of the transfer channel 3 located under the transfer gate electrode 7 provided between the multiplier gate electrode 10 and a PD portion 4 is controlled to be lower than the potential of the portion of the transfer channel 3 located under the readout gate electrode 11.

According to the fifth embodiment, as hereinabove described, the potentials of the portions of the transfer channel 3 located under the transfer gate electrode 7 and the readout gate electrode 11 respectively are controlled to be lower than the potentials of the portions of the transfer channel 3 located under the transfer gate electrodes 8 and 9 and the multiplier gate electrode 10 respectively while the potential of the portion of the transfer channel 3 located under the transfer gate electrode 7 adjacent to the multiplier gate electrode 10 is controlled to be lower than the potential of the portion of the transfer channel 3 located under the readout gate electrode 11 in an electron multiplying operation and an electron transfer operation. Thus, the transfer gate electrode 7 corresponding to the portion, having a high charge barrier, of the transfer channel 3 is arranged between the portion (electron multiplying portion 3b), having a remarkably fluctuating potential, of the transfer channel 3 located under the multiplier gate electrode 10 and the PD portion 4, whereby electrons can be inhibited from leaking toward the PD portion 4 over the charge barrier formed in the portion of the transfer channel 3 located under the transfer gate electrode 7 in the electron transferring operation and the electron multiplying operation. Further, the potential of the portion of the transfer channel 3 located under the readout gate electrode 11 is also lower than those of the portions of the transfer channel 3 located under the transfer gate electrodes 8 and 9 and the multiplier gate electrode 10 respectively, whereby the electrons can be inhibited from leaking toward the PD portion 4 over a charge barrier formed in the portion of the transfer channel 3 located under the transfer gate electrode 11.

The remaining structure and operations of the CMOS image sensor according to the fifth embodiment are similar to those of the CMOS image sensor according to the fourth embodiment.

Sixth Embodiment

In a CMOS image sensor according to a sixth embodiment of the present invention, a structure similar to that of the CMOS image sensor according to the third embodiment is added to a structure similar to that of the CMOS image sensor according to the aforementioned fourth embodiment.

Figure 20:
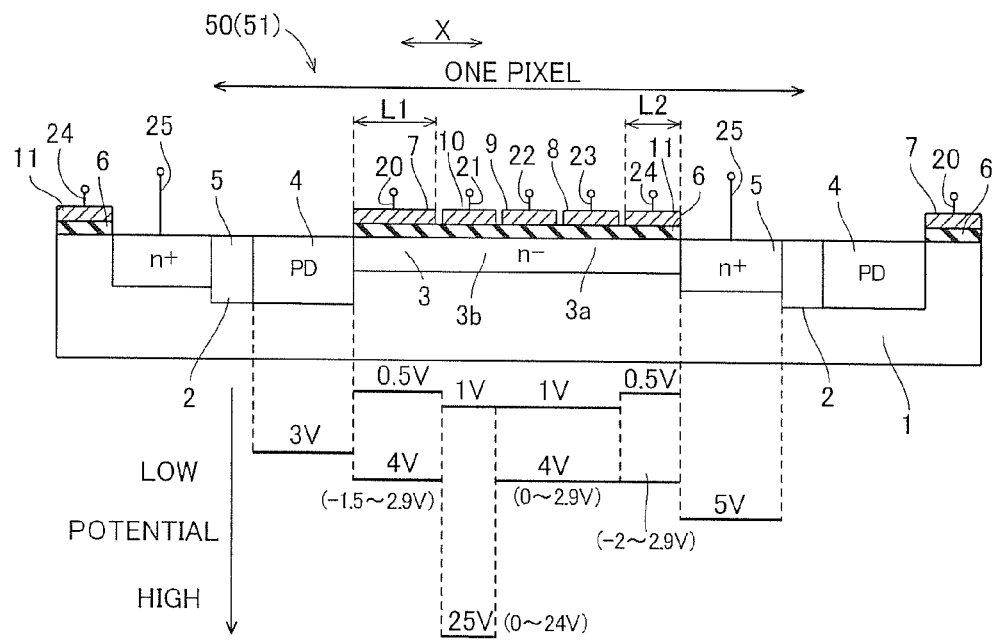
FIG. 20 is a sectional view showing the structure of a CMOS image sensor according to a sixth embodiment of the present invention.
Figure 21:
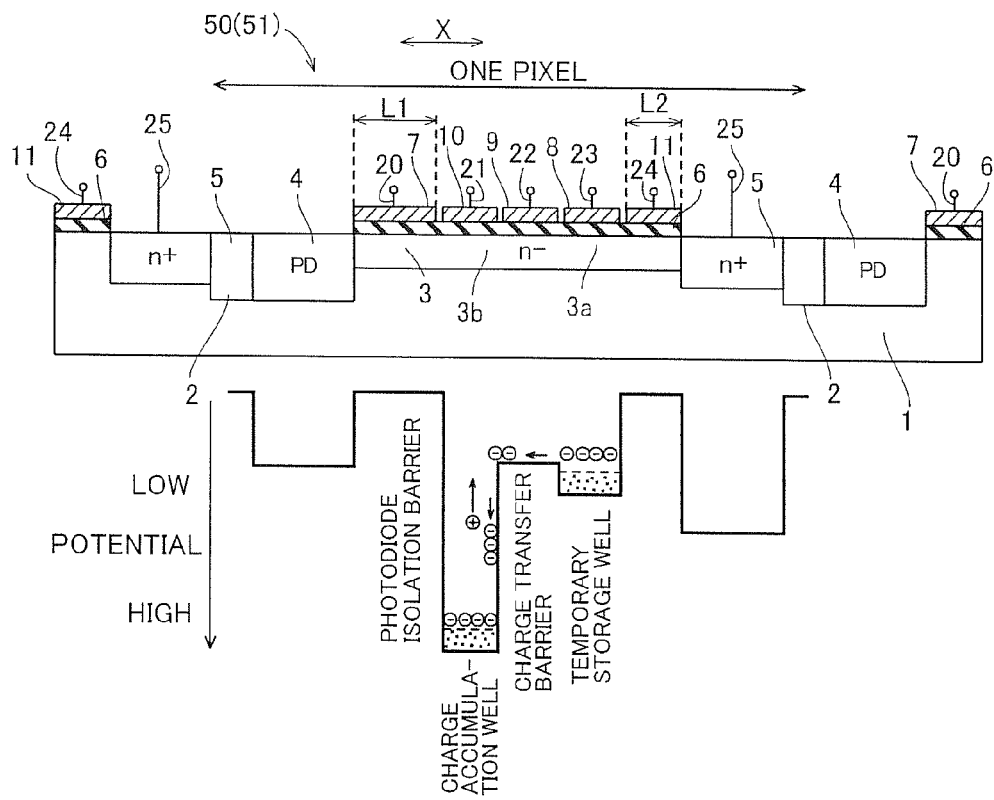
FIG. 21 is a potential diagram in the CMOS image sensor according to the sixth embodiment of the present invention.

According to the sixth embodiment, a transfer gate electrode 8 is provided between a transfer gate electrode 9 and a readout gate electrode 11 and a multiplier gate electrode 10 is provided on a side opposite to the transfer gate electrode 8 and the readout gate electrode 11 with respect to the transfer gate electrode 9 as shown in FIGS. 20 and 21, similarly to the fourth embodiment. According to the sixth embodiment, the gate length (L1 in FIG. 20) of a transfer gate electrode 7 provided between a PD portion 4 and the multiplier gate electrode 10 is rendered larger than those (L2 in FIG. 20) of the remaining gate electrodes other than the transfer gate electrode 7. According to the sixth embodiment, voltages of about −1.5 V and about −2 V are applied to the transfer gate electrode 7 and the readout gate electrode 11 respectively when OFF-state (low-level) clock signals φ1 and φ5 are applied to the transfer gate electrode 7 and the readout gate electrode 11 respectively. At this time, portions of a transfer channel 3 located under the transfer gate electrode 7 and the readout gate electrode 11 respectively are controlled to potentials of about 0.5 V.

According to the sixth embodiment, as hereinabove described, the gate length (L1 in FIG. 20) of the transfer gate electrode 7 adjacent to the multiplier gate electrode 10 having a remarkably fluctuating voltage is rendered larger than the gate lengths (L2 in FIG. 20) of the remaining gate electrodes other than the transfer gate electrode 7, so that the length (along arrow X in FIG. 20) of a barrier resulting from the charge barrier of the portion of the transfer channel 3 located under the transfer gate electrode 7 is also increased in proportion to the gate length of the transfer gate electrode 7. In an electron multiplying operation and an electron transferring operation, therefore, electrons can be more reliably inhibited from leaking toward the PD portion 4 over the barrier formed in the portion of the transfer channel 3 located under the transfer gate electrode 7.

The remaining structure and operations of the CMOS image sensor according to the sixth embodiment are similar to those of the CMOS image sensor according to the fourth embodiment.

Although the present invention has been described and illustrated in detail, it is clearly understood that the same is by way of illustration and example only and is not to be taken by way of limitation, the spirit and scope of the present invention being limited only by the terms of the appended claims.

Figure 22:
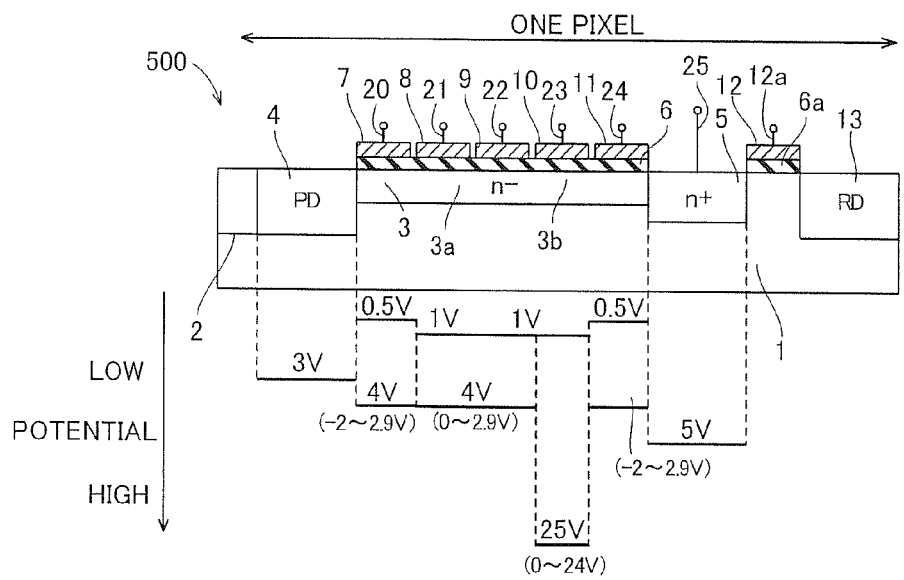
FIGS. 22 and 23 are diagrams for illustrating a modification of the CMOS image sensor according to the first embodiment of the present invention.
Figure 23:
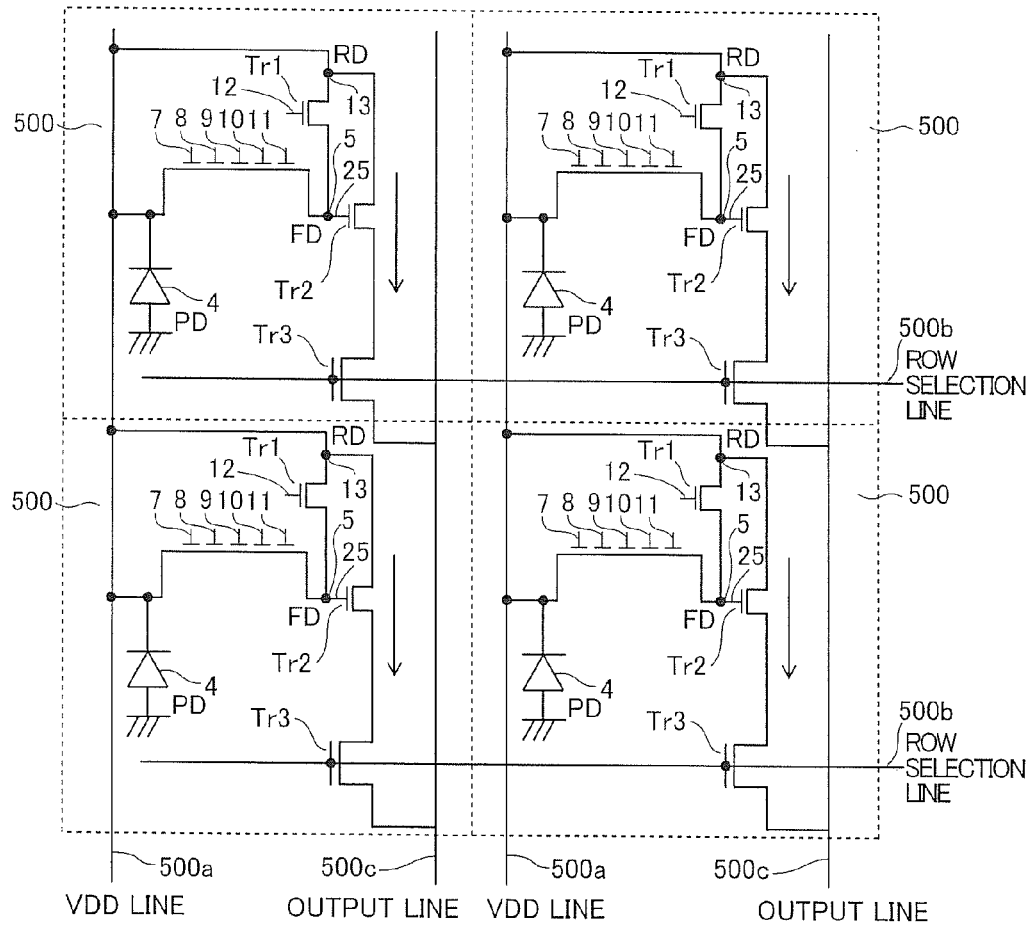

For example, while each of the aforementioned first to sixth embodiments is applied to the passive CMOS image sensor not amplifying signal charges in each pixel 50 as an exemplary image sensor, the present invention is not restricted to this but is also applicable to an active CMOS image sensor amplifying signal charges in each pixel. When the present invention is applied to an active CMOS image sensor employed as an exemplary image sensor, each pixel 500 includes a reset transistor Tr1 including a reset gate electrode 12, an amplification transistor Tr2 and a pixel selection transistor Tr3 in addition to the transfer gate electrodes 7, 8 and 9, the multiplier gate electrode 10 and the readout gate electrode 11 of the CMOS image sensor according to the aforementioned first embodiment, as in a modification of the first embodiment shown in FIGS. 22 and 23. A reset gate line 12a is connected to the reset gate electrode 12 of the reset transistor Tr1 through a contact portion, to supply a reset signal. The drain (reset drain 13) of the reset transistor Tr1 is connected to a power supply voltage (VDD) line 500a through another contact portion. The FD region 5 constituting the sources of the reset transistor Tr1 and the readout gate electrode 11 and the gate of the amplification transistor Tr2 are connected with each other by a signal line 25. The drain of the pixel selection transistor Tr3 is connected to the source of the amplification transistor Tr2. A row selection line 500b and an output line 500c are connected to the gate and the source of the pixel selection transistor Tr3 respectively.

In the active CMOS image sensor according to the modification of the first embodiment, the readout gate electrode 11 is on-off controlled every row, while the remaining gate electrodes other than the readout gate electrode 11 are simultaneously on-off controlled with respect to the overall pixel 500. The active CMOS image sensor amplifiers a signal in each pixel 500 and is therefore hardly influenced by noise in a pixel data reading path when reading pixel data, whereby reduction of picture quality can be suppressed.

While the one reset transistor 26 is formed every plurality of pixels 50 forming each column in each of the aforementioned first to sixth embodiments, the present invention is not restricted to this but the one reset transistor may alternatively be formed every one pixel.

While the portions of the transfer channel 3 located under the transfer gate electrodes 7, 8 and 9 and the readout gate electrode 11 respectively are controlled to the potentials of about 4 V when the transfer gate electrodes 7, 8 and 9 and the readout gate electrode 11 are in ON states in each of the aforementioned first to sixth embodiments, the present invention is not restricted to this but the portions of the transfer channel 3 located under the transfer gate electrodes 7, 8 and 9 and the readout gate electrode 11 respectively may alternatively be controlled to different potentials when the transfer gate electrodes 7, 8 and 9 and the readout gate electrode 11 are in ON states.

While the potentials of both of the portions of the transfer channel 3 corresponding to the transfer gate electrode 7 and the readout gate electrode 11 respectively are rendered lower than the potentials of the portions of the transfer channel 3 corresponding to the transfer gate electrodes 8 and 9 and the multiplier gate electrode 10 respectively when the transfer gate electrode 7 and the readout gate electrode 11 are brought into OFF states in each of the aforementioned first to sixth embodiments, the present invention is not restricted to this but the potential of the portion of the transfer channel 3 located under either the transfer gate electrode 7 or the readout gate electrode 11 may alternatively be rendered lower than the potentials of the portions of the transfer channel 3 corresponding to the transfer gate electrodes 8 and 9 and the multiplier gate electrode 10 respectively when the transfer gate electrode 7 and the readout gate electrode 11 are brought into OFF states. In this case, the potential of the portion of the transfer channel 3 located under either the transfer gate electrode 7 or the readout gate electrode 11 adjacent to the multiplier gate electrode 10 is more effectively rendered lower.

While the transfer channel 3, the PD portion 4 and the FD region 5 are formed on the surface of the p-type silicon substrate 1 in each of the aforementioned first to sixth embodiments, the present invention is not restricted to this but a p-type well region may alternatively be formed on the surface of an n-type silicon substrate for forming a transfer channel, a photodiode portion and a floating diffusion region on the surface of the p-type well region.

While the electrons are employed as the signal charges in each of the aforementioned first to sixth embodiments, the present invention is not restricted to this but holes may alternatively be employed as the signal charges by entirely reversing the conductivity type of the substrate impurity and the polarities of the applied voltages.

While the potential of the portion of the transfer channel 3 located under the readout gate electrode 11 is controlled to be lower than the potential of the portion of the transfer channel 3 located under the transfer gate electrode 7 when the transfer gate electrode 7 and the readout gate electrode 11 are brought into OFF states in the aforementioned second embodiment, the present invention is not restricted to this but the potential of the portion of the transfer channel 3 located under the transfer gate electrode 7 may alternatively be controlled to be lower than the potential of the portion of the transfer channel 3 located under the readout gate electrode 11.

Figure 24:
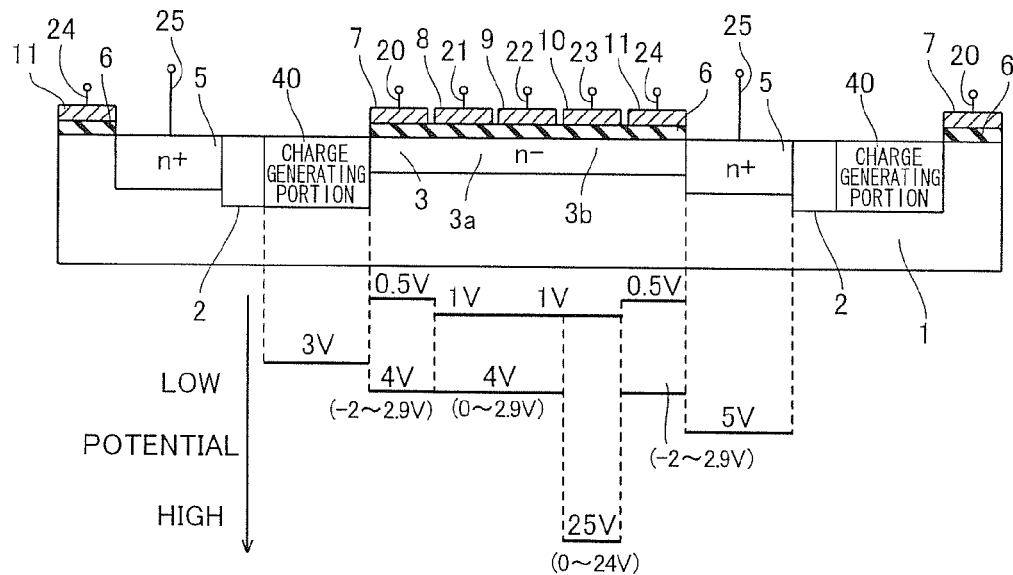
FIG. 24 is a diagram for illustrating a sensor unit as another modification of the first embodiment of the present invention.

While the aforementioned first embodiment is applied to the CMOS image sensor employed as an exemplary image sensor, the present invention is not restricted to this but is also applicable to a sensor unit, other than the image sensor, performing sensing by generating electrons. For example, the CMOS image sensor according to the first embodiment can alternatively be operated as a sensor unit by arranging a charge generating portion 40 in place of the PD portion 4 as in another modification of the first embodiment shown in FIG. 24, to attain effects similar to those of the aforementioned first embodiment with this structure. This sensor unit can also multiply generated electrons (sensed data) by performing operations similar to those of the CMOS image sensors aforementioned first to sixth embodiments.

Figure 25:
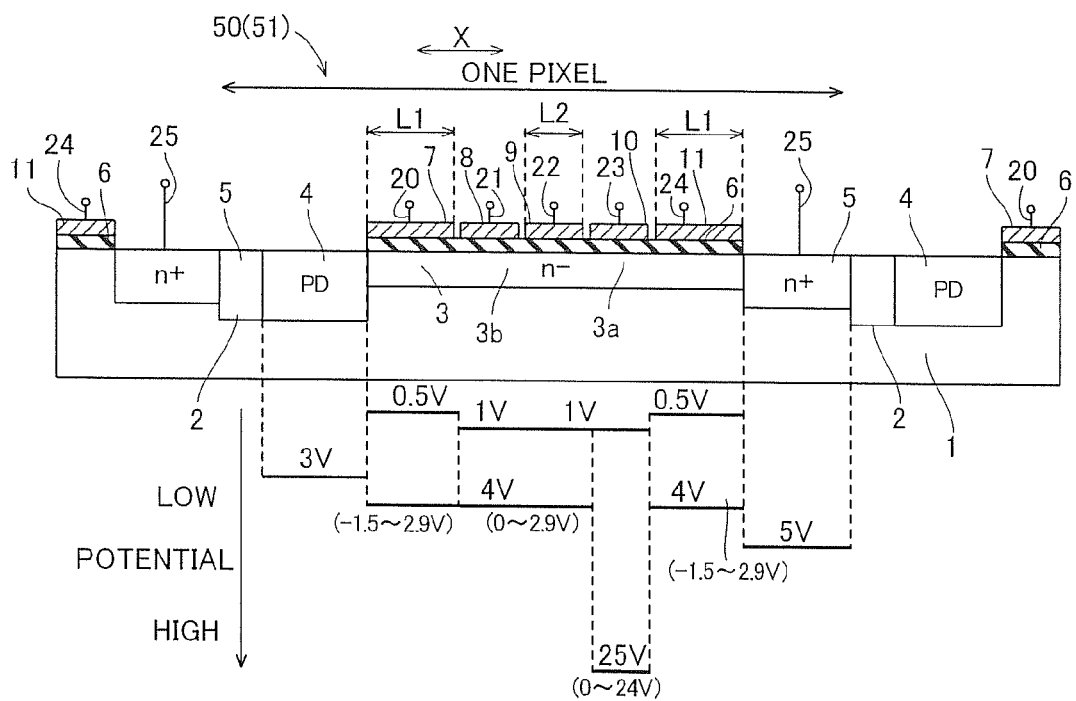
FIGS. 25 and 26 are diagrams for illustrating a modification of the CMOS image sensor according to the third embodiment of the present invention.
Figure 26:
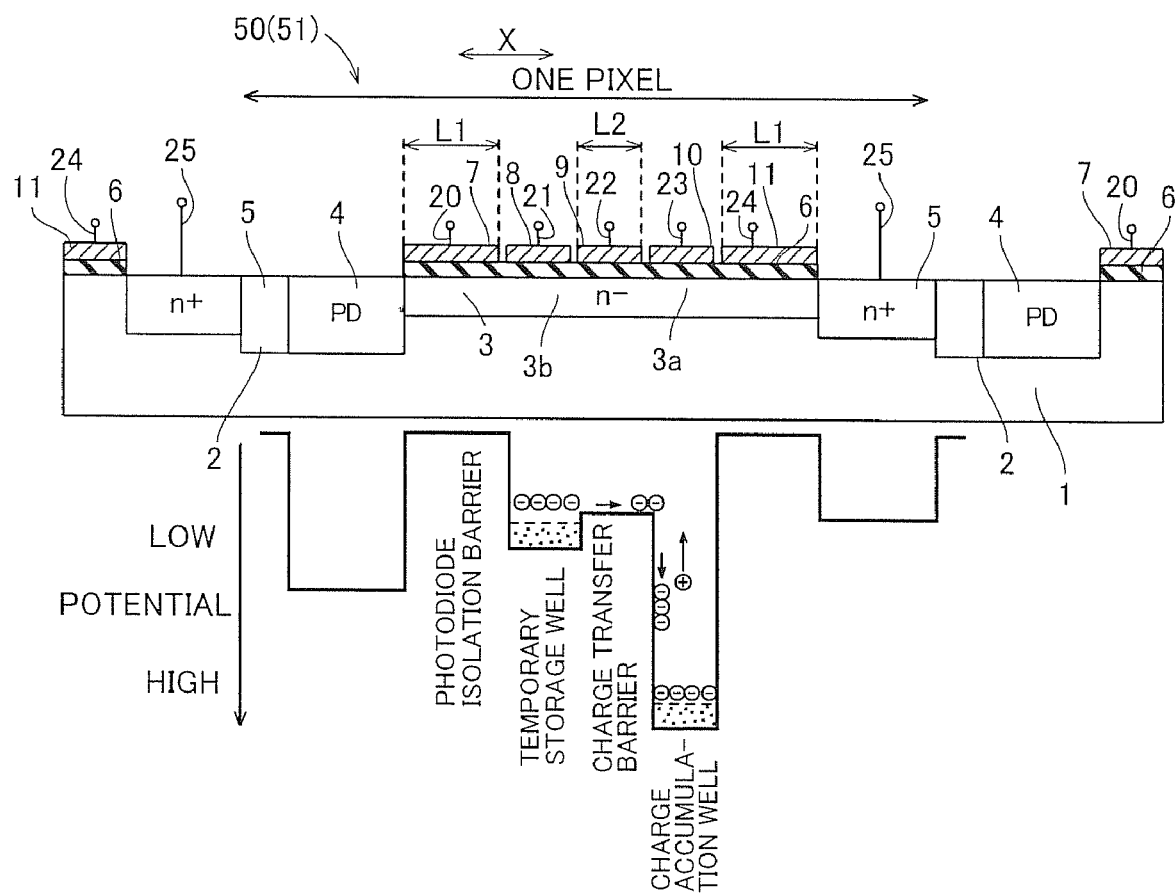

While the gate length of the readout gate electrode 11 is rendered larger than those of the remaining gate electrodes other than the readout gate electrode 11 in the aforementioned third embodiment, the present invention is not restricted to this but the gate lengths (L1 in FIG. 25) of both of the transfer gate electrode 7 and the readout gate electrode 11 may alternatively be rendered larger than the gate lengths (L2 in FIG. 25) of the gate electrodes other than the transfer gate electrode 7 and the readout gate electrode 11, as in a modification of the third embodiment shown in FIGS. 25 and 26. In this case, voltages of about −1.5 V are applied to the transfer gate electrode 7 and the readout gate electrode 11 respectively when OFF-state (low-level) clock signals φ1 and φ5 are supplied to the transfer gate electrode 7 and the readout gate electrode 11 respectively. At this time, both of the portions of the transfer channel 3 located under the transfer gate electrode 7 and the readout gate electrode 11 respectively are controlled to potentials of about 0.5 V. As a modification of the sixth embodiment shown in FIG. 21 in which the gate length of the transfer gate electrode 7 is larger than the gate lengths of the remaining gate electrodes other than the transfer gate electrode 7, the gate lengths of both of the transfer gate electrode 7 and the readout gate electrode 11 may be rendered larger than the gate lengths of the remaining gate electrodes other than the transfer gate electrode 7 and the readout gate electrode 11. According to this structure, the electrons can be inhibited from leaking toward both of the PD portion 4 and the FD region 5 in the electron transferring operation and the electron multiplying operation due to the gate lengths, larger than those of the remaining gate electrodes, of the transfer gate electrode 7 and the readout gate electrode 11 adjacent to the PD portion 4 and the FD region 5 respectively. Further, the potentials of the portions of the transfer channel 3 located under the transfer gate electrode 7 and the readout gate electrode 11 respectively are controlled to be minimized in the electron transferring operation and the electron multiplying operation. Thus, the electrons can be reliably inhibited from leaking toward both of the PD portion 4 and the FD region 5.

While the potential of the portion of the transfer channel 3 located under the transfer gate electrode 7 is controlled to be lower than the portion of the transfer channel 3 located under the readout gate electrode 11 when the transfer gate electrode 7 and the readout gate electrode 11 are brought into OFF states in the aforementioned fifth embodiment, the present invention is not restricted to this but the potential of the portion of the transfer channel 3 located under the readout gate electrode 11 may alternatively be controlled to be lower than the portion of the transfer channel 3 located under the transfer gate electrode 7.

What is claimed is:

1. An image sensor comprising:
a first electrode for forming an electric field storing signal charges;
a second electrode for forming another electric field increasing the number of the signal charges by impact ionization;
a photoelectric conversion portion generating the signal charges;
a third electrode provided to be adjacent to said photoelectric conversion portion for transferring the signal charges;
a voltage conversion portion for converting the signal charges into a voltage;
a fourth electrode provided to be adjacent to said voltage conversion portion for transferring the signal charges to said voltage conversion portion;
a transfer channel provided under said first electrode, said second electrode, said third electrode and said fourth electrode for performing a signal charge transferring operation and a signal charge increasing operation; and
a potential control portion controlling at least either the potential of a portion of said transfer channel corresponding to said third electrode or the potential of another portion of said transfer channel corresponding to said fourth electrode to be lower than the potentials of portions of said transfer channel corresponding to said first electrode and said second electrode respectively always in said signal charge increasing operation; wherein
each of pixels includes said first electrode, said second electrode, said third electrode, said fourth electrode, said photoelectric conversion portion, said voltage conversion portion, and said transfer channel.

2. The image sensor according to claim 1, wherein
said potential control portion controls the potential of a portion of said transfer channel corresponding to said third electrode and the potential of another portion of said transfer channel corresponding to said fourth electrode to be lower than the potentials of portions of said transfer channel corresponding to said first electrode and said second electrode respectively always in said signal charge increasing operation.

3. The image sensor according to claim 1, wherein
said potential control portion controls the potential of a portion of said transfer channel corresponding to said third electrode and the potential of another portion of said transfer channel corresponding to said fourth electrode to be lower than the potentials of portions of said transfer channel corresponding to said first electrode and said second electrode respectively always in said signal charge increasing operation, and controls the potentials of said portions of said transfer channel corresponding to said third electrode and said fourth electrode respectively to be different from each other in said signal charge transferring operation and said signal charge increasing operation.

4. The image sensor according to claim 3, wherein
said second electrode is arranged to be adjacent to either said third electrode or said fourth electrode, and
said potential control portion controls the potential of said portion of said transfer channel corresponding to either said third electrode or said fourth electrode arranged adjacently to said second electrode to be lower than the potential of said portion of said transfer channel corresponding to either said fourth electrode or said third electrode.

5. The image sensor according to claim 3, wherein
said second electrode for increasing the number of the signal charges is arranged adjacently to said fourth electrode for transferring the signal charges to said voltage conversion portion.

6. The image sensor according to claim 5, wherein
said potential control portion controls the potential of said portion of said transfer channel corresponding to said fourth electrode for transferring the signal charges to said voltage conversion portion to be lower than the potential of said portion of said transfer channel corresponding to said third electrode for transferring the signal charges in said signal charge transferring operation and said signal charge increasing operation.

7. The image sensor according to claim 3, wherein
said second electrode for increasing the number of the signal charges is arranged adjacently to said third electrode for transferring the signal charges.

8. The image sensor according to claim 7, wherein
the potential of said portion of said transfer channel corresponding to said third electrode for transferring the signal charges is controlled to be lower than the potential of said portion of said transfer channel corresponding to said fourth electrode for transferring the signal charges to said voltage conversion portion in said signal charge transferring operation and said signal charge increasing operation.

9. The image sensor according to claim 1, wherein
the length of at least either said third electrode or said fourth electrode along a signal charge transfer direction is larger than the length of any of said electrodes other than said third electrode and said fourth electrode along said signal charge transfer direction.

10. The image sensor according to claim 9, wherein
said second electrode for increasing the number of the signal charges is arranged to be adjacent to either said third electrode or said fourth electrode, and
the length of either said third electrode or said fourth electrode arranged adjacently to said second electrode in a signal charge transfer direction is larger than the length of either said fourth electrode or said third electrode in said signal charge transfer direction.

11. The image sensor according to claim 9, wherein
the length of either said third electrode or said fourth electrode arranged adjacently to said second electrode in said signal charge transfer direction is larger than the length of either said fourth electrode or said third electrode in said signal charge transfer direction, and the potentials of said portions of said transfer channel corresponding to said third electrode and said fourth electrode respectively are lower than the potentials of said portions of said transfer channel corresponding to said electrodes other than said third electrode and said fourth electrode in said signal charge transferring operation and said signal charge increasing operation.

12. The image sensor according to claim 9, wherein
the lengths of both of said third electrode and said fourth electrode along said signal charge transfer direction are larger than the length of any of said electrodes other than said third electrode and said fourth electrode along said signal charge transfer direction.

13. The image sensor according to claim 12, wherein
the potentials of said portions of said transfer channel corresponding to both of said third electrode and said fourth electrode respectively are lower than the potentials of said portions of said transfer channel corresponding to said electrodes other than said third electrode and said fourth electrode in said signal charge transferring operation and said signal charge increasing operation.

14. The image sensor according to claim 1, further comprising a fifth electrode provided between said first electrode and said second electrode for transferring the signal charges, for alternately performing said signal charge increasing operation of controlling said first electrode and said fifth electrode to transfer the signal charges stored in said portion of said transfer channel corresponding to said first electrode to said portion of said transfer channel corresponding to said second electrode in a state where said second electrode forms the electric field impactionizing the signal charges and said signal charge transferring operation of controlling said first electrode, said fifth electrode and said second electrode to transfer the signal charges increased in number by the electric field formed by said second electrode to said portion of said transfer channel corresponding to said first electrode.

15. The image sensor according to claim 1, wherein
the potential of said portion of said transfer channel corresponding to said third electrode is controlled to be higher than the potential of said photoelectric conversion portion when the signal charges are transferred from said photoelectric conversion portion to said transfer channel, and
the potential of said portion of said transfer channel corresponding to said third electrode exhibited when the signal charges are transferred from said photoelectric conversion portion to said transfer channel is controlled to be substantially identical to at least the potential of said portion of said transfer channel corresponding to said first electrode forming the electric field storing the signal charges.

16. The image sensor according to claim 1, wherein
the potential of said portion of said transfer channel corresponding to said fourth electrode is controlled to be higher than the potential of said portion of said transfer channel corresponding to either said first electrode or said second electrode adjacent to said fourth electrode and lower than the potential of said voltage conversion portion when the signal charges are transferred from said transfer channel to said voltage conversion portion, and
the potential of said portion of said transfer channel corresponding to said fourth electrode exhibited when the signal charges are transferred from said transfer channel to said voltage conversion portion is controlled to be substantially identical to at least the potential of said portion of said transfer channel corresponding to said first electrode forming the electric field storing the signal charges.

17. The image sensor according to claim 1, so formed as to apply a voltage suppressing transfer of the signal charges from said portion of said transfer channel corresponding to said fourth electrode to said voltage conversion portion in said signal charge transferring operation and said signal charge increasing operation to said fourth electrode.

18. A sensor unit comprising:
a first electrode for forming an electric field storing signal charges;
a second electrode for forming another electric field increasing the number of the signal charges by impact ionization;
a charge generating portion generating the signal charges;
a third electrode provided to be adjacent to said charge generating portion for transferring the signal charges;
a voltage conversion portion for converting the signal charges into a voltage;
a fourth electrode provided to be adjacent to said voltage conversion portion for transferring the signal charges to said voltage conversion portion,
a transfer channel provided under said first electrode, said second electrode, said third electrode and said fourth electrode for performing a signal charge transferring operation and a signal charge increasing operation; and
a potential control portion controlling at least either the potential of a portion of said transfer channel corresponding to said third electrode or the potential of another portion of said transfer channel corresponding to said fourth electrode to be lower than the potentials of portions of said transfer channel corresponding to said first electrode and said second electrode respectively always in said signal charge increasing operation, wherein
each of pixels includes said first electrode, said second electrode, said third electrode, said fourth electrode, said photoelectric conversion portion, said voltage conversion portion, and said transfer channel.

19. The sensor unit according to claim 18, further comprising a fifth electrode provided between said first electrode and said second electrode for transferring the signal charges, for alternately performing said signal charge increasing operation of controlling said first electrode and said fifth electrode to transfer the signal charges stored in said portion of said transfer channel corresponding to said first electrode to said portion of said transfer channel corresponding to said second electrode in a state where said second electrode forms the electric field impact-ionizing the signal charges and said signal charge transferring operation of controlling said first electrode, said fifth electrode and said second electrode to transfer the signal charges increased in number by the electric field formed by said second electrode to said portion of said transfer channel corresponding to said first electrode.

* * * * *